(12) United States Patent
Hatakeyama et al.

(10) Patent No.: US 7,368,218 B2
(45) Date of Patent: *May 6, 2008

(54) POSITIVE RESIST COMPOSITIONS AND PATTERNING PROCESS

(75) Inventors: Jun Hatakeyama, Joetsu (JP); Tatsushi Kaneko, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 231 days.

This patent is subject to a terminal disclaimer.

(21) Appl. No.: 11/101,591

(22) Filed: Apr. 8, 2005

(65) Prior Publication Data

US 2005/0227174 A1    Oct. 13, 2005

(30) Foreign Application Priority Data

Apr. 9, 2004    (JP) ............................ 2004-115088

(51) Int. Cl.
   *G03F 7/039*    (2006.01)
   *G03F 7/20*    (2006.01)
   *G03F 7/30*    (2006.01)

(52) U.S. Cl. .................. 430/270.1; 430/326; 430/330; 430/910; 430/914

(58) Field of Classification Search ...................... None
   See application file for complete search history.

(56) References Cited

U.S. PATENT DOCUMENTS

| | | | |
|---|---|---|---|
| 4,491,628 A | 1/1985 | Ito et al. | |
| 5,310,619 A | 5/1994 | Crivello et al. | |
| 5,968,713 A | 10/1999 | Nozaki et al. | |
| 6,013,416 A | 1/2000 | Nozaki et al. | |
| 6,200,725 B1 | 3/2001 | Takechi et al. | |
| 6,280,898 B1 | 8/2001 | Hasegawa et al. | |
| 6,329,125 B2 | 12/2001 | Takechi et al. | |
| 6,448,420 B1 | 9/2002 | Kinsho et al. | |
| 6,746,818 B2 | 6/2004 | Kinsho et al. | |
| 2001/0003640 A1 | 6/2001 | Takechi et al. | |
| 2001/0026901 A1 | 10/2001 | Maeda et al. | |
| 2005/0208419 A1* | 9/2005 | Inabe et al. .............. 430/270.1 | |

FOREIGN PATENT DOCUMENTS

| | | |
|---|---|---|
| JP | 63-27829 A | 2/1988 |
| JP | 2-27660 B2 | 6/1990 |
| JP | 9-73173 A | 3/1997 |
| JP | 9-90637 A | 4/1997 |
| JP | 9-230595 A | 9/1997 |
| JP | 10-10739 A | 1/1998 |
| JP | 2000-26446 A | 1/2000 |
| JP | 2000-159758 A | 6/2000 |
| JP | 2000-327633 A | 11/2000 |
| JP | 2002-371114 A | 12/2002 |
| JP | 2003-40480 A | 2/2003 |
| WO | WO-97/33198 A1 | 9/1997 |

OTHER PUBLICATIONS

In Advances in Resist Technology and Processing XVII, Proceedings of SPIE vol. 3999 (2000), "Dissolution/swelling behavior of cycloolefin polymers in aqueous base", Hiroshi Ito et al., pp. 2-12.
Advances in Resist Technology and Processing XX, Proceedings of SPIE vol. 5039 (2003), "Hydrogen bonding and aqueous base dissolution behavior of hexafluoroisopropanol-bearing polymers", Hiroshi Ito et al., pp. 70-79.
Advances in Resist Technology and Processing XX, Proceedings of SPIE vol. 5039 (2003), "Rational Design in Cyclic Olefin Resists for Sub-100nm Lithography", pp. 61-69.
Journal of Photopolymer Science and Technology, vol. 16, No. 4 (2003), "Fluoropolymer Resists: Progress and Properties", H. Ito et al., pp. 523-536.

* cited by examiner

*Primary Examiner*—Sin Lee
(74) *Attorney, Agent, or Firm*—Birch, Stewart, Kolasch & Birch, LLP

(57) ABSTRACT

A polymer which is obtained from a combination of (meth)acrylate having a bridged ring lactone group and (meth)acrylate having an acid leaving group with a hexafluoroalcohol group is used as a base resin to formulate a positive resist composition which when exposed to high-energy radiation and developed, exhibits a high sensitivity, a high resolution, and a minimal line edge roughness due to controlled swell during development. The composition also has excellent dry etching resistance.

6 Claims, 1 Drawing Sheet

POSITIVE RESIST COMPOSITIONS AND PATTERNING PROCESS

CROSS-REFERENCE TO RELATED APPLICATION

This non-provisional application claims priority under 35 U.S.C. §119(a) on Patent Application No. 2004-115088 filed in Japan on Apr. 9, 2004, the entire contents of which are hereby incorporated by reference.

This invention relates to positive resist compositions, typically of the chemical amplification type, adapted for exposure to high-energy radiation, which have a significantly high contrast of alkali dissolution rate before and after the exposure, a high sensitivity, a high resolution, a minimal line edge roughness, and good etching resistance, and which are especially suited as micropatterning materials for the manufacture of VLSI or the formation of photomask patterns; and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, passed through the 0.25 micron rule, and currently entered the mass production phase on the 0.18 micron rule. Engineers have started investigation on the 0.15 micron rule, with the trend toward a finer pattern rule being accelerated. A wavelength changeover from KrF to shorter wavelength ArF excimer laser (193 nm) is expected to enable miniaturization of the design rule to 0.13 μm or less. Since conventionally used novolac resins and polyvinylphenol resins have very strong absorption in proximity to 193 nm, they are difficult to use as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

Among others, a focus is drawn on (meth)acrylic resin base resists featuring a high resolution. One of the (meth) acrylic resins proposed thus far is a combination of (meth) acrylic units having methyladamantane ester as acid labile group units with (meth)acrylic units having lactone ring ester as adhesive group units as disclosed in JP-A 9-90637. Norbornyl lactone is also proposed as an adhesive group having enhanced etching resistance as disclosed in JP-A 2000-26446, JP-A 2000-159758 and JP-A 2002-371114.

Of the outstanding tasks associated with the ArF lithography, it is desired to minimize line edge roughness and to reduce residues following development. One of the factors causing line edge roughness is swelling during development. While the polyhydroxystyrene used as the resist for KrF lithography, in which the phenol moiety is a weak acidic group and has an appropriate alkali solubility, is resistant to swelling, polymers containing hydrophobic cycloaliphatic groups, which must be dissolved using carboxylic acids having a high acidity, are likely to swell during development.

The development performance of resists can be quantified by the quartz crystal microbalance (QCM) technique. The quantity of swell during development is reported in Proc. SPIE Vol. 3999, p2 (2000). Although the swelling of a film being developed could not be observed by the prior art film thickness measurement relying on optical interference, the QCM technique designed to electrically measure any change of film weight enables to observe any weight increase of swollen film. The cited reference discusses the swelling of ArF resists based on cycloolefin polymers. Substantial swells are observed when carboxylic acid is used as the adhesive group.

It was also reported that hexafluorocarbinol groups are effective for reducing the swell. Norbornene having hexafluorocarbinol groups experiences minimal swell. Resists based on polynorbornene having such groups as the adhesive group are reported in Proc. SPIE Vol. 5039, p70 (2003) and Proc. SPIE Vol. 5039, p61 (2003). Acrylates having hexafluorocarbinol groups are also described in JP-A 2003-40480.

SUMMARY OF THE INVENTION

An object of the invention is to provide a positive resist composition which when exposed to high-energy radiation and developed, exhibits a high sensitivity, a high resolution, and a minimal line edge roughness due to controlled swell during development, and leaves minimal residues following development. Another object of the invention is to provide a process for forming a pattern using the same.

The inventors continued research works targeting a positive resist composition which when exposed to high-energy radiation and developed, exhibits a high sensitivity, a high resolution, and a minimal line edge roughness due to controlled swell during development, and leaves minimal residues following development.

For the $F_2$ lithography, resists using hexafluoroalcohol have been studied. It is reported in J. Photopolym. Sci. Technol., Vol. 16, No. 4, p523 (2003) that hexafluoroalcohol has an acidity approximate to that of phenol and is least swollen in a developer liquid. Also known are polynorbornene having hexafluoroalcohol and α-trifluoromethyl acrylate having hexafluoroalcohol pendants. It has been reported how these polymers perform when exposed to ArF excimer laser light. The inventors have discovered that although a polymer having only hexafluoroalcohol as the adhesive group is not fully adhesive, a corresponding copolymer having copolymerized therein recurring units having lactone as the adhesive group is endowed with a good balance of hydrophilicity, alkaline solubility and adhesion. In particular, when a polymer which is obtained from a combination of (meth)acrylate having a bridged ring lactone group and (meth)acrylate having an acid-labile leaving group with an adhesive group having alkaline solubility as typified by hexafluoroalcohol is used as the base resin, there is provided a positive resist composition which when exposed to high-energy radiation and developed, exhibits a high sensitivity, a high resolution, and a minimal line edge roughness due to controlled swell during development, and leaves minimal residues following development. The composition also has excellent dry etching resistance.

According to the invention, there is provided a resist composition comprising a polymer comprising recurring units of the general formulae (1a), (2a), and (1b).

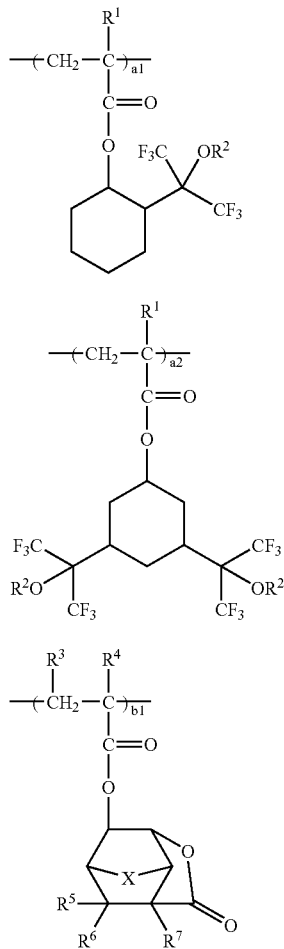

Herein $R^1$ is each independently hydrogen or methyl, $R^2$ is each independently hydrogen, an acyl group of 1 to 10 carbon atoms, or an acid labile group, $R^3$ is hydrogen, methyl or —CO$_2$R$^8$, $R^4$ is hydrogen, methyl or —CH$_2$CO$_2$R$^8$, $R^5$ to $R^7$ are each independently hydrogen, methyl or —CO$_2$R$^9$, $R^8$ is each independently hydrogen or a straight, branched or cyclic alkyl group of 1 to 15 carbon atoms, $R^9$ is hydrogen or a straight, branched or cyclic alkyl group of 1 to 10 carbon atoms, X is —CH$_2$—, —O— or —S—, saving —CH$_2$— when all of $R^5$ to $R^7$ are hydrogen. The subscripts a1, a2 and b1 are numbers satisfying $0 \leq a1/(a1+a2+b1) \leq 0.9$, $0 \leq a2/(a1+a2+b1) \leq 0.9$, $0 < (a1+a2)/(a1+a2+b1) \leq 0.9$, and $0 < b1/(a1+a2+b1) \leq 0.8$.

When exposed to high-energy radiation and developed, the positive resist composition comprising the above polymer as a base resin has a significantly high contrast of alkali dissolution rate before and after the exposure, a high sensitivity, a high resolution, and a minimal line edge roughness due to controlled swell during development, leaves minimal residues following etching, and exhibits good etching resistance. Owing to these advantages, the composition is fully acceptable in industrial practice and especially suited as a micropatterning material for the manufacture of VLSI or the formation of photomask patterns.

The composition is preferably formulated as a chemically amplified positive resist composition comprising (A) the above polymer as a base resin, (B) an organic solvent, and (C) a photoacid generator. With this formulation, in the exposed area, the rate of dissolution of the polymer in a developer liquid is accelerated by acid-catalyzed reaction. Then the chemically amplified positive resist composition has so high a sensitivity that it is very suitable as the micropatterning material which is currently needed for the manufacture of VLSI. The positive resist composition may further include a dissolution inhibitor. The inclusion of a dissolution inhibitor enhances the difference in dissolution rate between the exposed and unexposed areas, leading to a further improvement in resolution. The positive resist composition may further include a basic compound and/or a surfactant. The addition of a basic compound holds down the rate of diffusion of acid within the resist film, leading to a further improvement in resolution. The addition of a surfactant improves or controls the applicability of the resist composition.

A pattern may be formed on a semiconductor substrate or mask substrate using the resist composition of the invention, typically by applying the resist composition onto a substrate to form a coating, heat treating the coating, exposing it to high-energy radiation, and developing it with a developer liquid. Heat treatment may also be carried out after the exposure and before the development. The process may, of course, be followed by various steps such as etching, resist removal and cleaning steps. The high-energy radiation typically has a wavelength in the range of 180 to 200 nm. The resist composition containing the inventive polymer as the base resin is especially effective for exposure to high-energy radiation in the wavelength range of 180 to 200 nm because its sensitivity to the exposure wavelength in the range is very high.

According to the invention, the polymer having copolymerized specific recurring units having a hexafluorocarbinol group, (meth)acrylate units having a bridged ring lactone group, and (meth)acrylate units having an acid labile group is compounded as a base resin into a resist composition, which has a high sensitivity and a high resolution. The composition is minimized in line edge roughness and leaves minimal residues following development due to controlled swell during development, as demonstrated through measurement by the QCM technique. There are thus provided positive resist compositions, especially a chemically amplified positive resist compositions, which are suited as micropatterning materials for the manufacture of VLSI or the formation of photomask patterns.

DESCRIPTION OF THE PREFERRED EMBODIMENTS

Polymer

Figure 1:
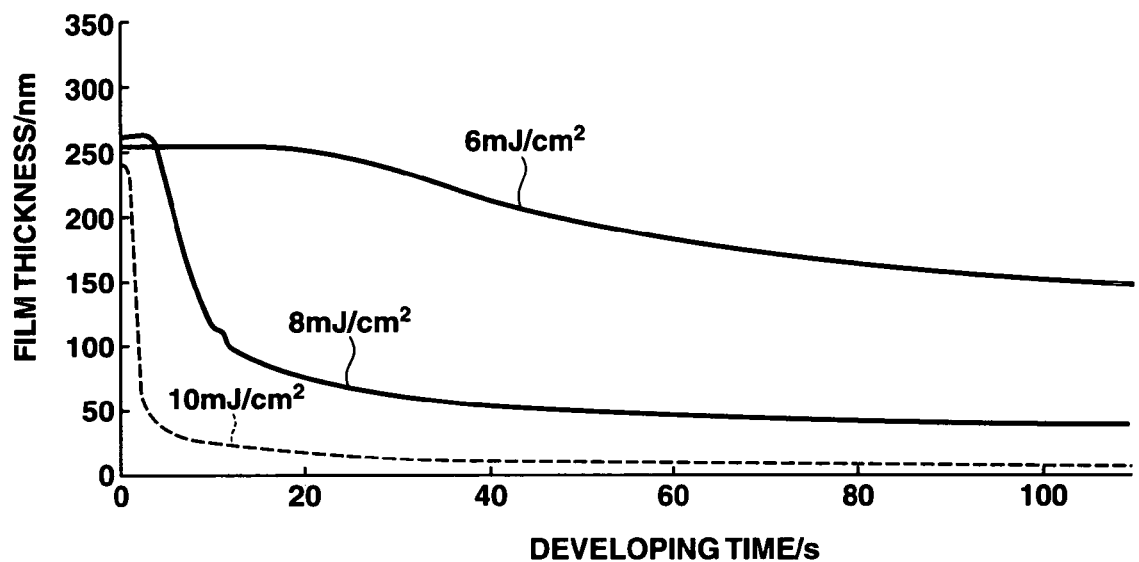
FIG. 1 is a graph showing the thickness versus developing time of a resist film formed from the resist composition of Example 1, as analyzed by the QCM technique.

The resist composition of the invention comprises a polymer or high molecular weight compound comprising recurring units of the general formulae (1a), (2a), and (1b).

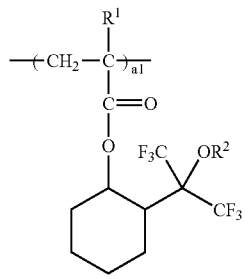
(1a)

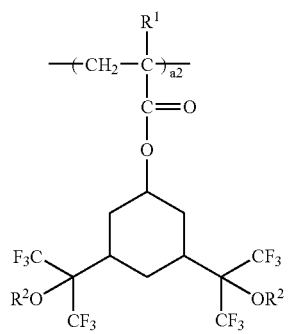
(2a)

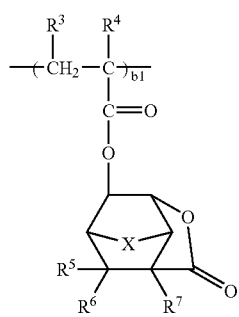
(1b)

In the formulae, $R^1$ is each independently hydrogen or methyl, $R^2$ is each independently hydrogen, an acyl group of 1 to 10 carbon atoms, or an acid labile group, $R^3$ is hydrogen, methyl or —$CO_2R^8$, $R^4$ is hydrogen, methyl or —$CH_2CO_2R^8$, and $R^5$ to $R^7$ are each independently hydrogen, methyl or —$CO_2R^9$. $R^8$ is each independently hydrogen or a straight, branched or cyclic alkyl group of 1 to 15 carbon atoms, $R^9$ is hydrogen or a straight, branched or cyclic alkyl group of 1 to 10 carbon atoms. X is —$CH_2$—, —O— or —S—, saving —$CH_2$— when all of $R^5$ to $R^7$ are hydrogen. The subscripts a1, a2 and b1, representative of the molar proportions of the respective units in the polymer, are numbers satisfying $0 \leq a1/(a1+a2+b1) \leq 0.9$, $0 \leq a2/(a1+a2+b1) \leq 0.9$, $0 < (a1+a2)/(a1+a2+b1) \leq 0.9$, and $0 < b1/(a1+a2+b1) \leq 0.8$.

Suitable acyl groups represented by $R^2$ include acetyl and pivaloyl groups, with those groups having 1 to 6 carbon atoms being preferred. The acid labile group is described later. Suitable alkyl groups represented by $R^8$ include methyl, ethyl, propyl, isopropyl, butyl, isobutyl, tert-butyl, pentyl, cyclopentyl, hexyl, cyclohexyl, octyl and decyl, with those groups having 1 to 12 carbon atoms being preferred. Suitable alkyl groups represented by $R^9$ are the same as exemplified for $R^8$, with those groups having 1 to 12 carbon atoms being preferred.

Examples of the monomers from which the recurring units of formulae (1a) and (2a) are derived are given below.

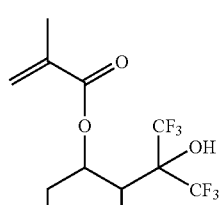

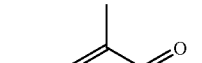
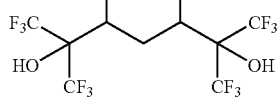

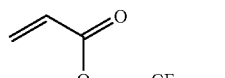
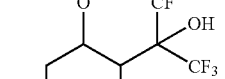

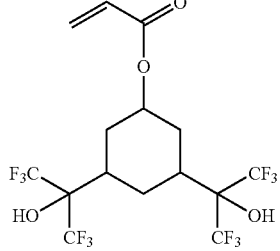

-continued

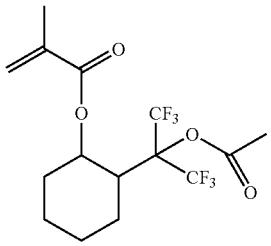

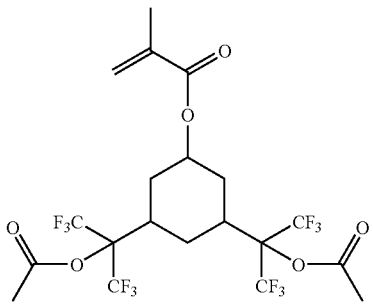

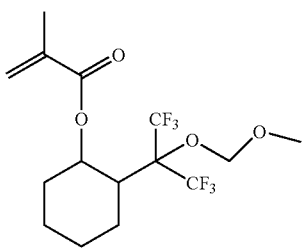

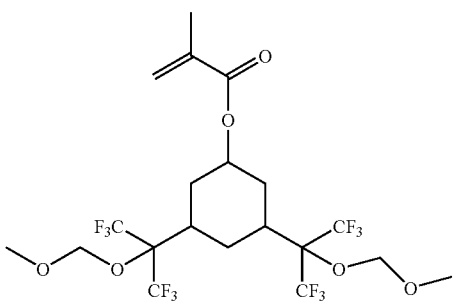

In the monomer prior to polymerization, the group attached to the carbon atom of —C(CF$_3$)$_2$— is an acetyl group, which is converted to a hydroxyl group through alkaline hydrolysis after polymerization. In some cases, the hydrogen atom of the hydroxyl group may be replaced by an acid labile group.

The polymer of the invention should have copolymerized therein recurring units having hexafluorocarbinol as represented by formulae (1a) and (2a) and recurring units of an ester monomer having a specific lactone ring as represented by formula (1b).

Examples of the monomers from which the recurring units of formula (1b) are derived are given below.

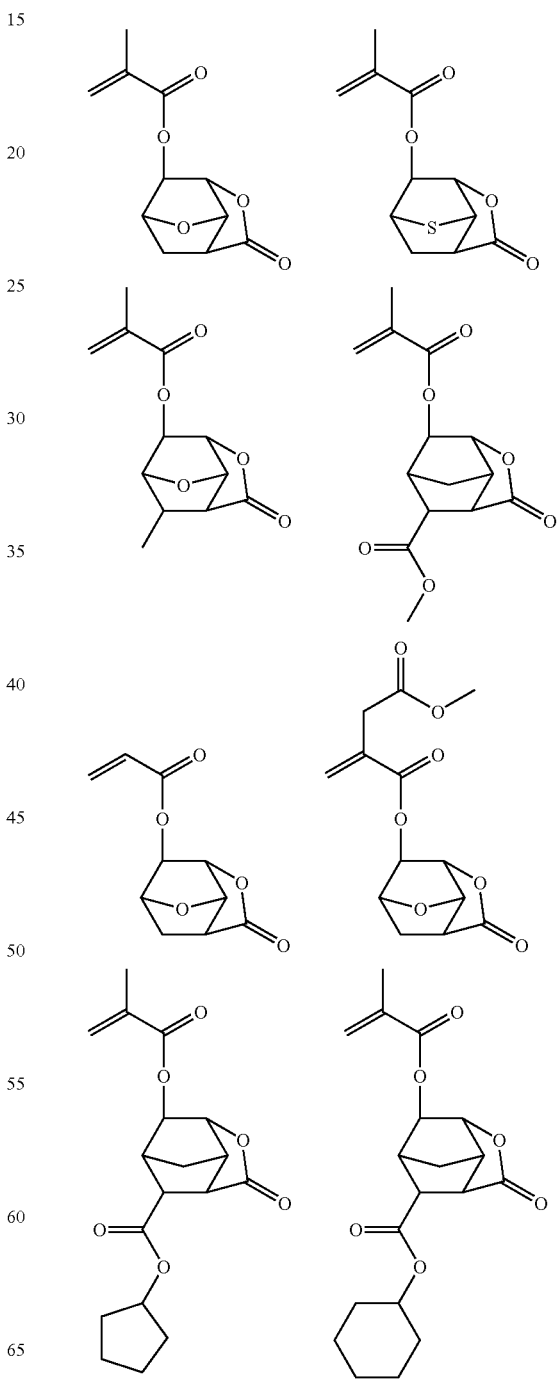

-continued

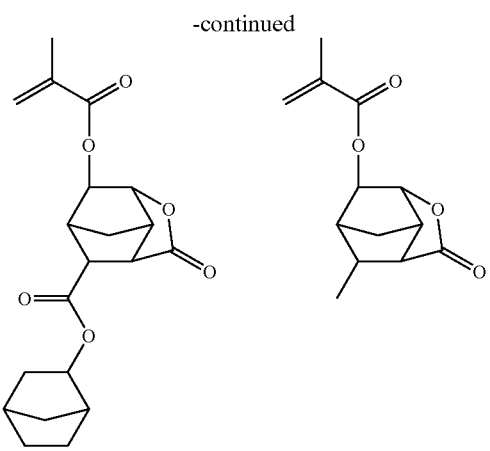

In order that the resist composition be positive working, the preferred polymer in the resist composition has further copolymerized therein a monomer having an acid labile group represented by the general formula (1c).

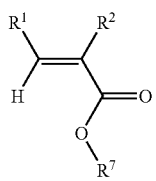

(1c)

Herein, $R^1$ and $R^2$ are as defined above, and $R^7$ is an acid labile group.

The acid labile groups represented by $R^3$ and $R^7$ in formulae (1a) and (1c) may be identical or different and selected from a variety of such groups, preferably from groups of formulae (AL10) and (AL11), a tertiary alkyl group of 4 to 40 carbon atoms represented by formula (AL12), and an oxoalkyl group of 4 to 20 carbon atoms.

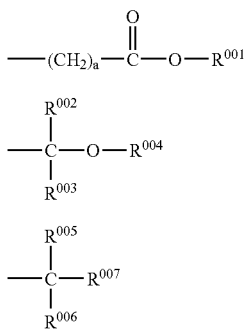

(AL10)

(AL11)

(AL12)

In formulae (AL10) and (AL11), $R^{001}$ and $R^{004}$ each are a straight, branched or cyclic alkyl group of 1 to 20 carbon atoms which may contain a heteroatom such as oxygen, sulfur, nitrogen or fluorine. The subscript "a" is an integer of 0 to 10. $R^{002}$ and $R^{003}$ each are hydrogen or a straight, branched or cyclic alkyl group of 1 to 20 carbon atoms which may contain a heteroatom such as oxygen, sulfur, nitrogen or fluorine. Alternatively, a pair of $R^{002}$ and $R^{003}$, $R^{002}$ and $R^{004}$, or $R^{003}$ and $R^{004}$, taken together, may form a ring with the carbon atom to which they are attached, the ring having 3 to 10 carbon atoms, especially 3 to 8 carbon atoms. In formula (AL12), $R^{005}$, $R^{006}$ and $R^{007}$ each are a straight, branched or cyclic alkyl group of 1 to 20 carbon atoms. Alternatively, a pair of $R^{005}$ and $R^{006}$, $R^{005}$ and $R^{007}$, or $R^{006}$ and $R^{007}$, taken together, may form a ring with the carbon atom to which they are attached, the ring having 3 to 16 carbon atoms, especially 3 to 12 carbon atoms.

Illustrative examples of the groups of formula (AL10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxy-carbonylmethyl and 2-tetrahydrofuranyloxycarbonylmethyl as well as substituent groups of the following formulae (AL10)-1 to (AL10)-9.

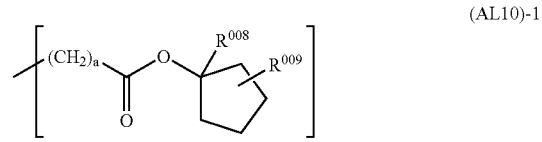

(AL10)-1

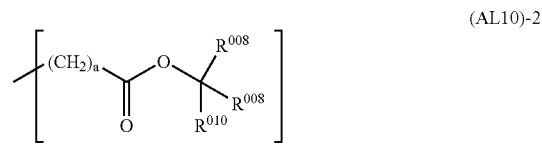

(AL10)-2

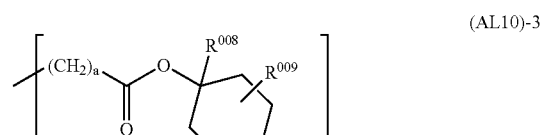

(AL10)-3

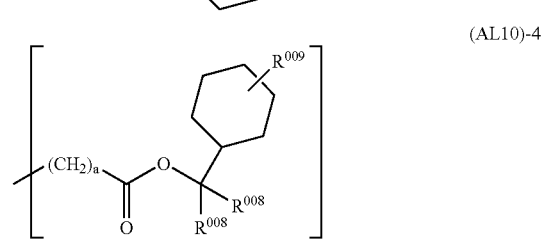

(AL10)-4

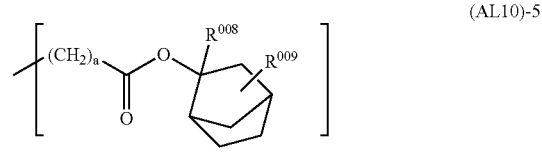

(AL10)-5

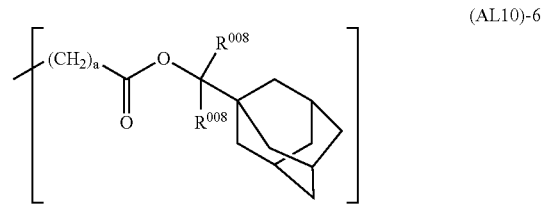

(AL10)-6

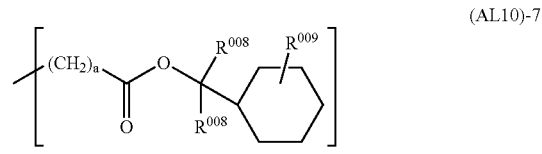

(AL10)-7

-continued

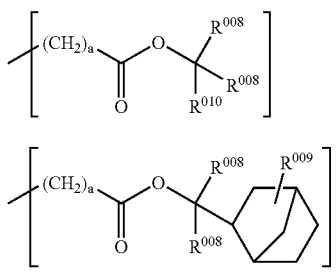
(AL10)-8

(AL10)-9

In formulae (AL10)-1 to (AL10)-9, $R^{008}$ is independently a straight, branched or cyclic alkyl group of 1 to 8 carbon atoms or an aryl or aralkyl group of 6 to 20 carbon atoms; $R^{009}$ is hydrogen or a straight, branched or cyclic alkyl group of 1 to 20 carbon atoms; $R^{010}$ is an aryl or aralkyl group of 6 to 20 carbon atoms; and "a" is an integer of 0 to 10.

Illustrative examples of the acetal group of formula (AL11) include those of the following formulae (AL11)-1 to (AL11)-35.

—CH$_2$—O—CH$_3$ (AL11)-1

—CH$_2$—O—CH$_2$—CH$_3$ (AL11)-2

—CH$_2$—O—(CH$_2$)$_2$—CH$_3$ (AL11)-3

—CH$_2$—O—(CH$_2$)$_3$—CH$_3$ (AL11)-4

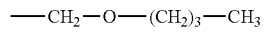
(AL11)-5

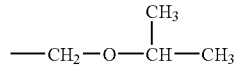
(AL11)-6

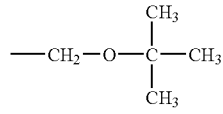
(AL11)-7

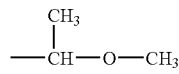
(AL11)-8

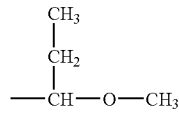
(AL11)-9

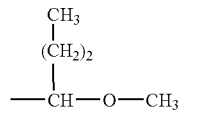
(AL11)-10

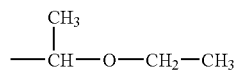
(AL11)-11

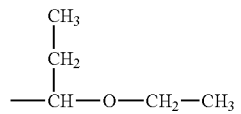
(AL11)-12

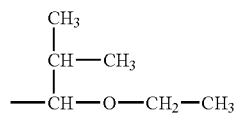
(AL11)-13

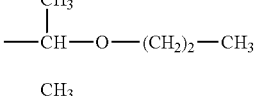
(AL11)-13

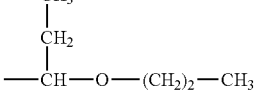
(AL11)-14

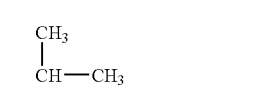
(AL11)-15

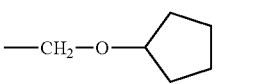
(AL11)-16

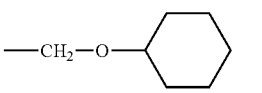
(AL11)-17

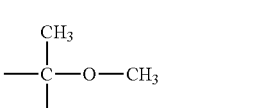
(AL11)-18

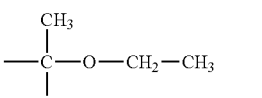
(AL11)-19

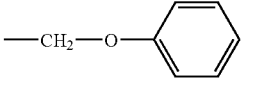
(AL11)-20

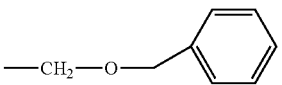
(AL11)-21

(AL11)-22

(AL11)-23

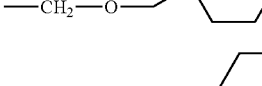
(AL11)-24

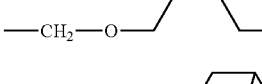
(AL11)-25

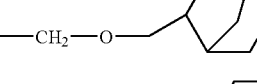
(AL11)-26

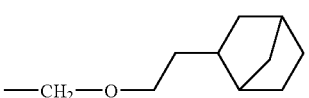
(AL11)-27

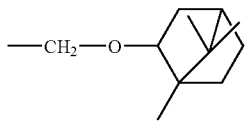
(AL11)-28

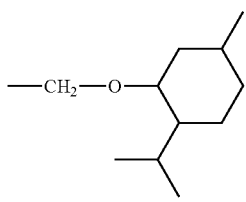
(AL11)-29

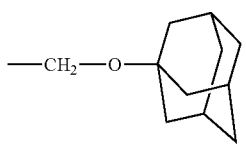
(AL11)-30

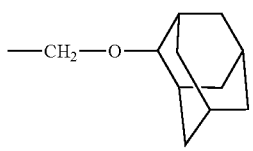
(AL11)-31

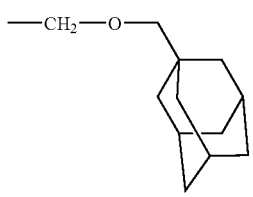
(AL11)-32

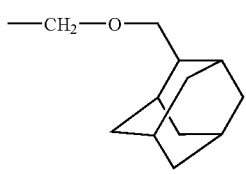
(AL11)-33

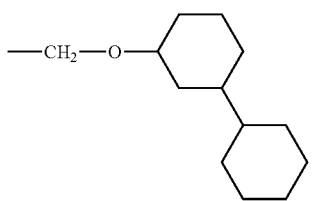
(AL11)-34

The polymer may be crosslinked within the molecule or between molecules with acid labile groups of formula (AL11a) or (AL11b).

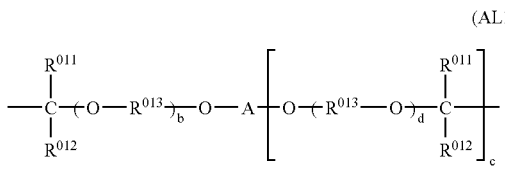
(AL11a)

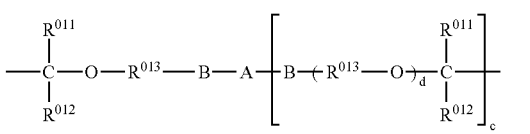
(AL11b)

Herein $R^{011}$ and $R^{012}$ each are hydrogen or a straight, branched or cyclic alkyl group of 1 to 8 carbon atoms, or $R^{011}$ and $R^{012}$, taken together, may form a ring, and $R^{011}$ and $R^{012}$ are straight or branched alkylene groups of 1 to 8 carbon atoms when they form a ring. $R^{013}$ is a straight, branched or cyclic alkylene group of 1 to 10 carbon atoms. Each of b and d is 0 or an integer of 1 to 10, preferably 0 or an integer of 1 to 5, and c is an integer of 1 to 7. "A" is a (c+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted with hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic alkylene, alkyltriyl and alkyltetrayl groups of 1 to 20 carbon atoms, and arylene groups of 6 to 30 carbon atoms, which may be separated by a heteroatom such as oxygen, sulfur or nitrogen or in which some of the hydrogen atoms attached to carbon atoms may be substituted with hydroxyl, carboxyl, acyl groups or halogen atoms. The subscript c is preferably an integer of 1 to 3.

The crosslinking acetal groups of formulae (AL11a) and (AL11b) are exemplified by the following formulae (AL11)-36 through (AL11)-43.

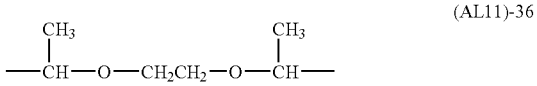
(AL11)-36

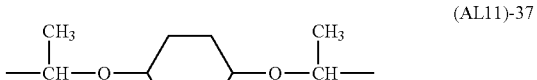
(AL11)-37

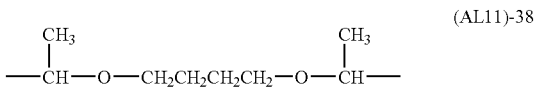
(AL11)-38

(AL11)-39

(AL11)-40

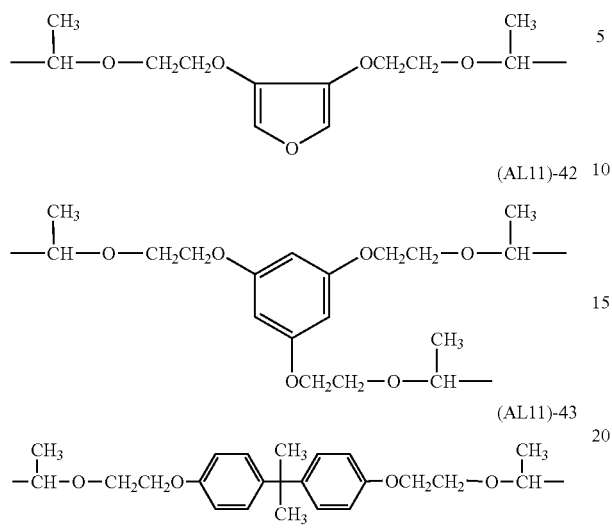
Illustrative examples of the tertiary alkyl of formula (AL12) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl groups as well as those of (AL12)-1 to (AL12)-18.
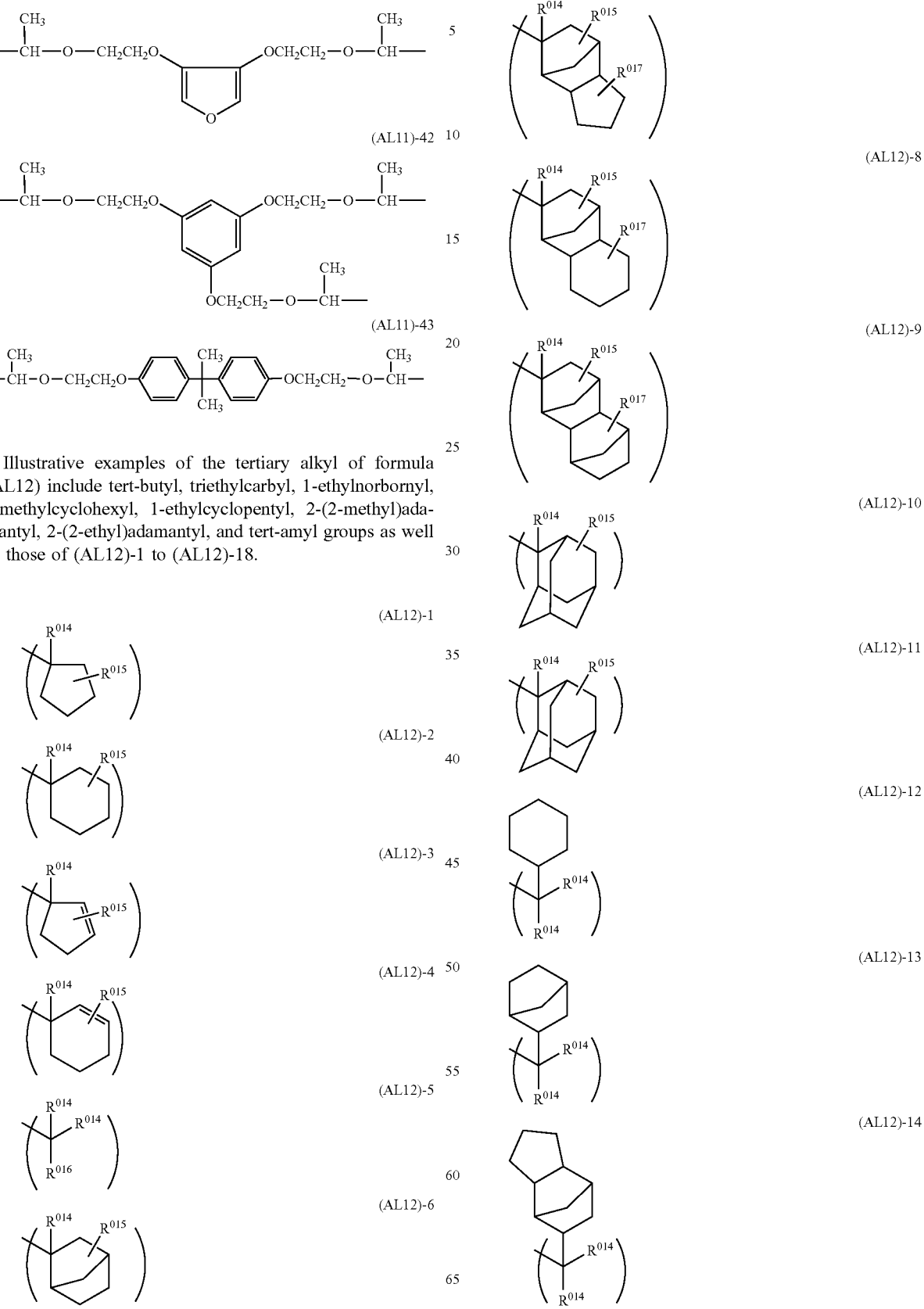

-continued (AL12)-15

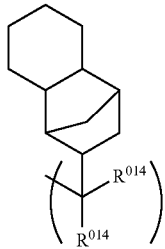

(AL12)-16

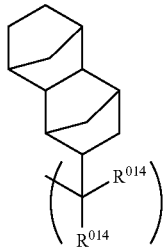

(AL12)-17

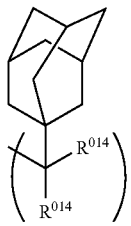

(AL12)-18

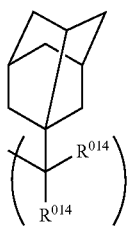

Herein $R^{014}$ is independently a straight, branched or cyclic alkyl group of 1 to 8 carbon atoms, or an aryl or aralkyl group of 6 to 20 carbon atoms; $R^{015}$ and $R^{017}$ each are hydrogen or a straight, branched or cyclic alkyl group of 1 to 20 carbon atoms; and $R^{016}$ is an aryl or aralkyl group of 6 to 20 carbon atoms.

With $R^{018}$ representative of a di- or more valent alkylene or arylene group included as shown in formulae (AL12)-19 and (AL12)-20, the polymer may be crosslinked within the molecule or between molecules. In formulae (AL12)-19 and (AL12)-20, $R^{014}$ is as defined above; $R^{018}$ is a straight, branched or cyclic alkylene group of 1 to 20 carbon atoms or arylene group which may contain a heteroatom such as oxygen, sulfur or nitrogen; and c is an integer of 1 to 3.

(AL12)-19

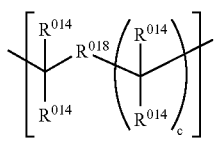

(AL12)-20

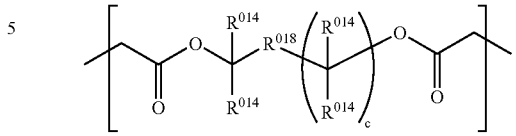

The groups represented by $R^{014}$, $R^{015}$, $R^{016}$ and $R^{017}$ may contain a heteroatom such as oxygen, nitrogen or sulfur, examples of which are illustrated by those of the following formulae (13)-1 to (13)-7.

—(CH$_2$)$_4$OH (13)-1

—(CH$_2$)$_2$O(CH$_2$)$_3$CH$_3$ (13)-2

 (13)-3

—(CH$_2$)$_2$O(CH$_2$)$_2$OH (13)-4

—(CH$_2$)$_6$OH (13)-5

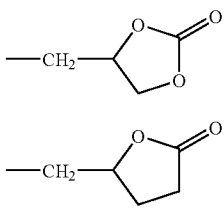 (13)-6

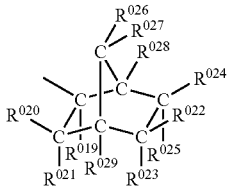 (13)-7

Of the acid labile groups of formula (AL12), recurring units having an exo-form structure represented by the formula (AL12)-21 are preferred.

(AL12)-21

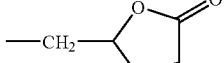

Herein, $R^{019}$ is a straight, branched or cyclic alkyl group of 1 to 8 carbon atoms or a substituted or unsubstituted aryl group of 6 to 20 carbon atom; $R^{020}$ to $R^{025}$, $R^{028}$ and $R^{029}$ are each independently hydrogen or a monovalent hydrocarbon group of 1 to 15 carbon atoms which may contain a heteroatom; and $R^{026}$ and $R^{027}$ are hydrogen. Alternatively, a pair of $R^{020}$ and $R^{021}$, $R^{022}$ and $R^{024}$, $R^{022}$ and $R^{025}$, $R^{023}$ and $R^{025}$, $R^{023}$ and $R^{029}$, $R^{024}$ and $R^{028}$, $R^{026}$ and $R^{027}$, or $R^{027}$ and $R^{028}$, taken together, may form a ring, and in this case, each R is a divalent hydrocarbon group of 1 to 15 carbon atoms which may contain a heteroatom. Also, a pair of $R^{020}$ and $R^{029}$, $R^{026}$ and $R^{029}$, or $R^{022}$ and $R^{024}$ which are attached to adjoining carbon atoms may bond together directly to form a double bond. The formula also represents an enantiomer Suitable alkyl groups include methyl, ethyl, propyl, isopropyl, butyl, isobutyl, tert-butyl, pentyl, cyclopentyl, hexyl, cyclohexyl and octyl, with those groups having 1 to 12 carbon atoms being preferred. The preferred aryl group is phenyl. Suitable monovalent hydrocarbon groups which may contain a heteroatom include alkyl groups as exemplified above, methoxymethyl, methoxyethyl and methoxypropyl groups, with those having 1 to 6 carbon atoms being preferred. Suitable divalent hydrocarbon groups which may contain a heteroatom include the foregoing monovalent hydrocarbon groups with one of the hydrogen atoms attached to carbon atoms being eliminated. When a pair of $R^{020}$ and $R^{021}$ form a ring, for example, the ring preferably has 3 to 10 carbon atoms, more preferably 3 to 8 carbon atoms.

The monomers of formula (1c) are described in U.S. Pat. No. 6,448,420 (JP-A 2000-327633), and illustrative, non-limiting examples thereof are given below.

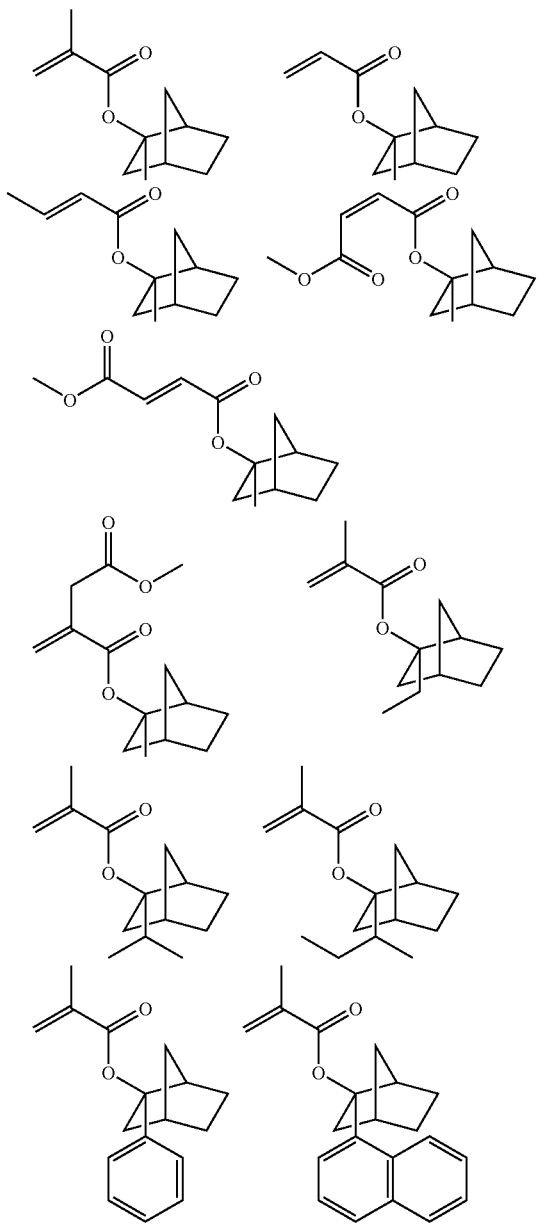

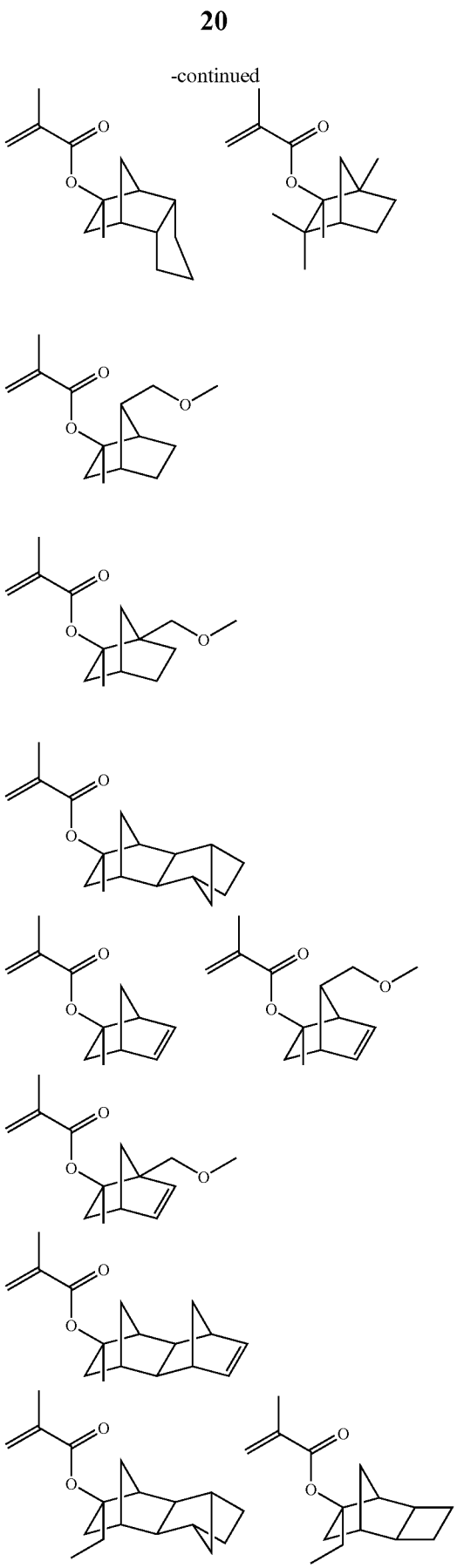

-continued

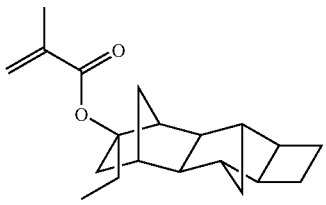

The acid labile groups of formula (AL12) also include acid labile groups having furandiyl, tetrahydrofurandiyl or oxanorbornanediyl as represented by formula (AL12)-22. It is preferred that these acid labile groups be included in the recurring units derived from the monomers of formula (1c).

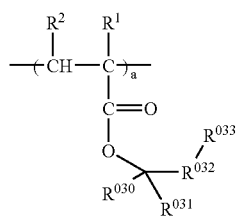

(AL12)-22

Herein, $R^{030}$ and $R^{031}$ are each independently a straight, branched or cyclic monovalent hydrocarbon group of 1 to 10 carbon atoms. $R^{030}$ and $R^{031}$, taken together, may form an aliphatic hydrocarbon ring with the carbon atom to which they are attached. $R^{032}$ is a divalent group selected from furandiyl, tetrahydrofurandiyl and oxanorbornanediyl. $R^{033}$ is hydrogen or a straight, branched or cyclic monovalent hydrocarbon group of 1 to 10 carbon atoms which may contain a heteroatom.

Suitable monovalent hydrocarbon groups include alkyl groups. Suitable aliphatic hydrocarbon rings include those of 3 to 12 carbon atoms, for example, cyclopentyl, cyclohexyl, norbornyl and adamantyl groups.

Examples of the monomers from which recurring units substituted with acid labile groups having furandiyl, tetrahydrofurandiyl and oxanorbornanediyl are derived are given below. Note that Me is methyl and Ac is acetyl.

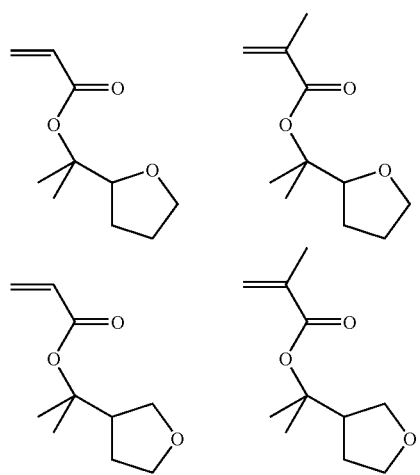

-continued

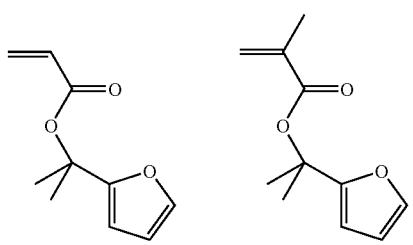

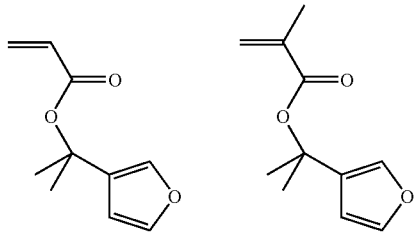

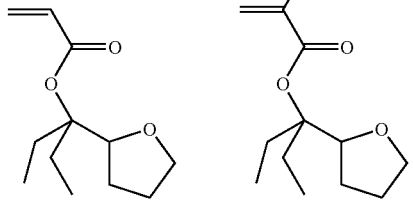

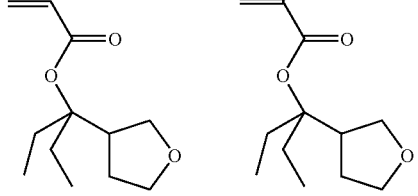

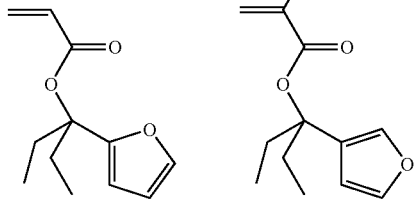

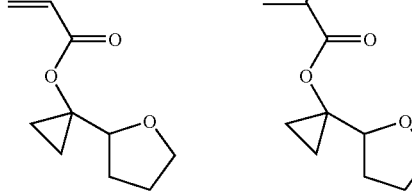

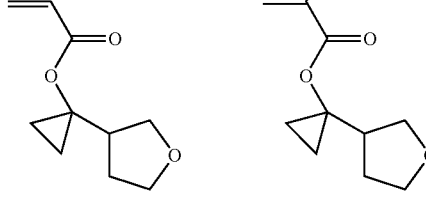

-continued
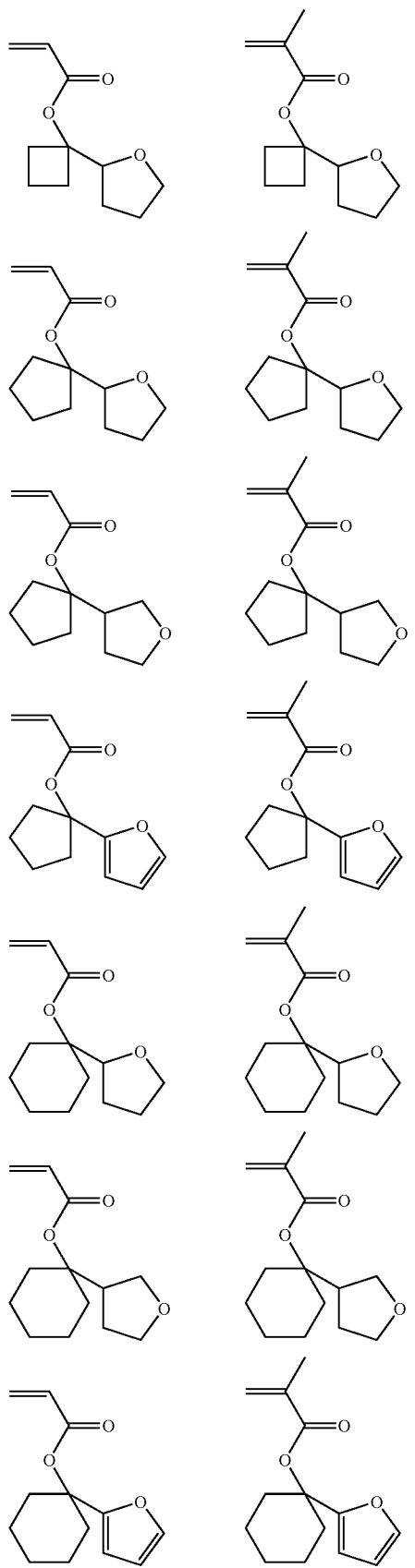
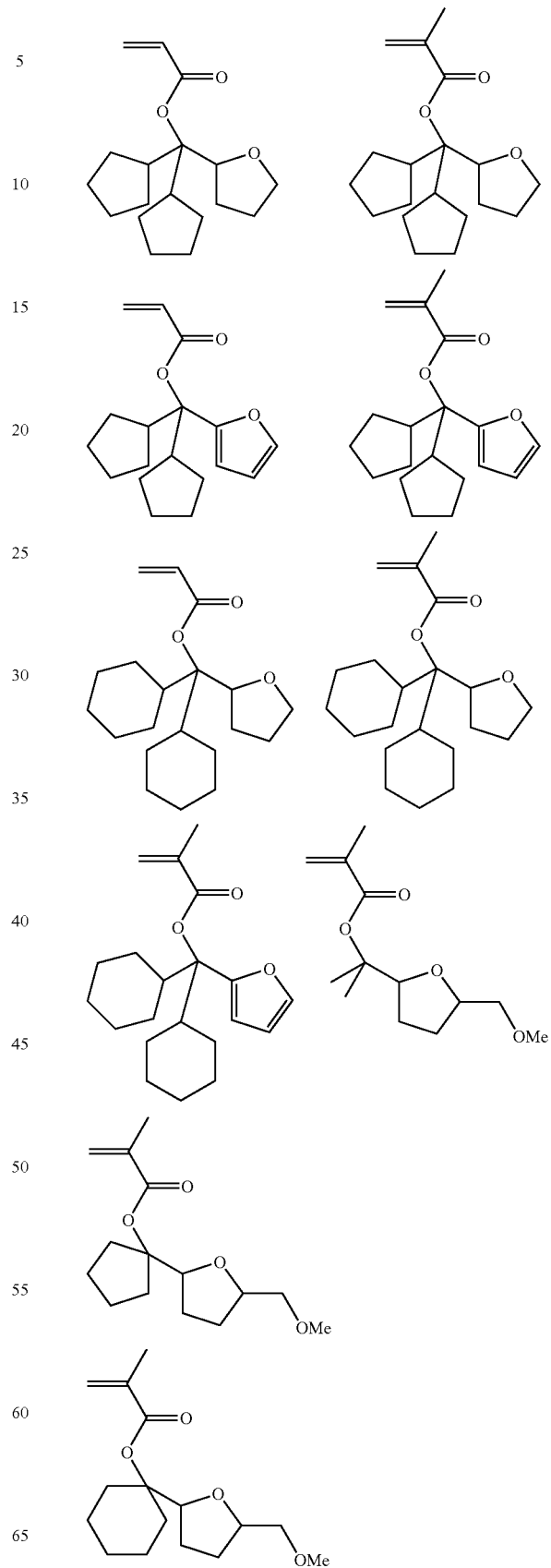

-continued
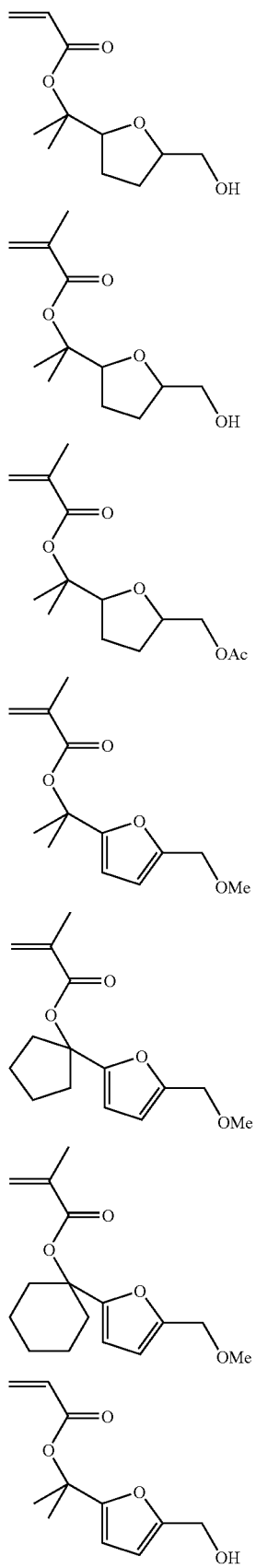
-continued
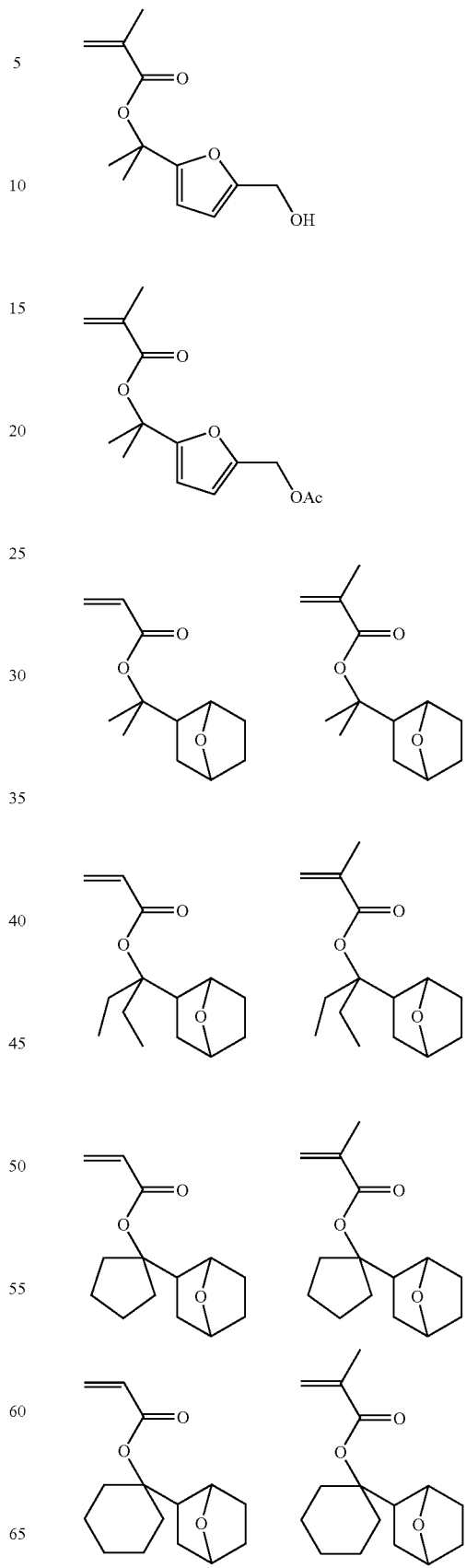

-continued
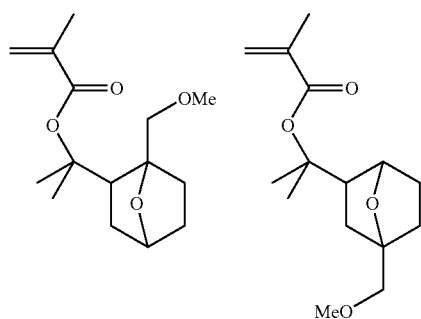
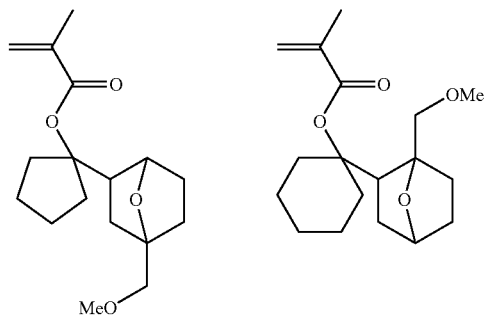
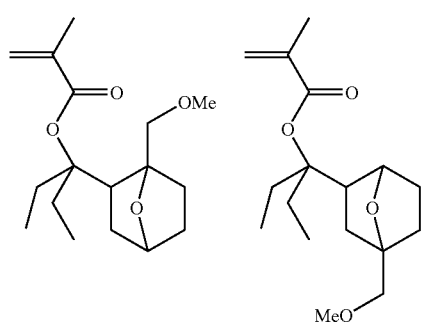
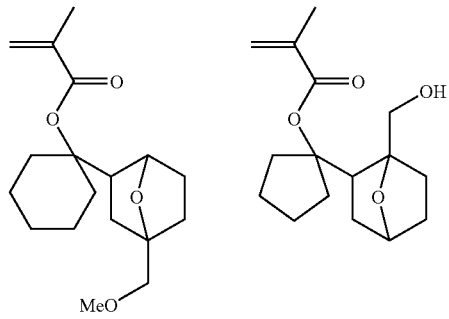
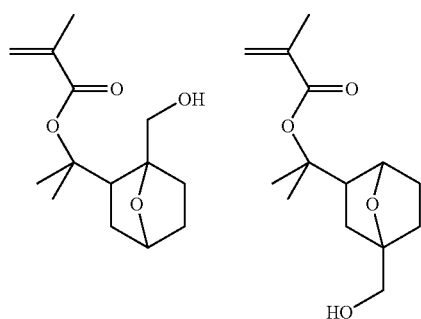
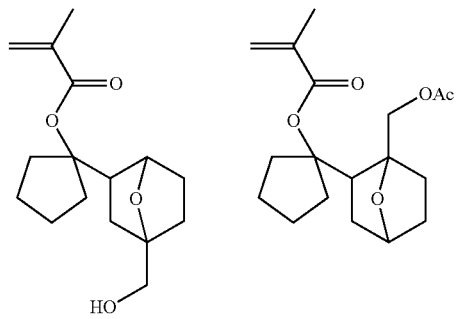
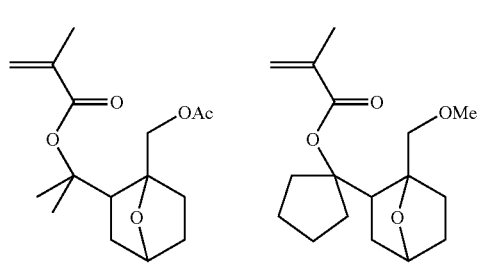
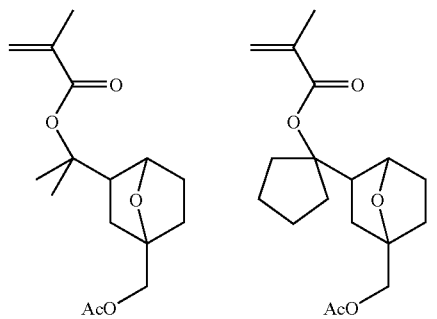

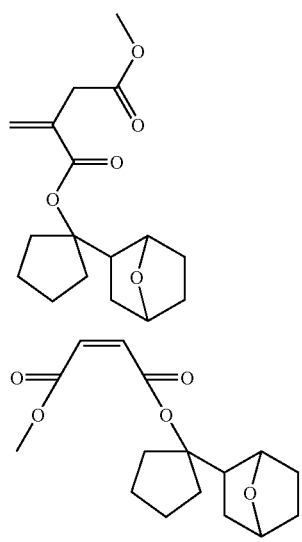
While the polymer to be compounded in the resist composition of the invention includes essentially recurring units of formulae (1a), (2a) and (1b), it may have copolymerized therein recurring units having adhesive groups other than formulae (1a), (2a) and (1b). Specifically, recurring units derived from monomers (1d), listed below, may be incorporated.
Monomers (1d)
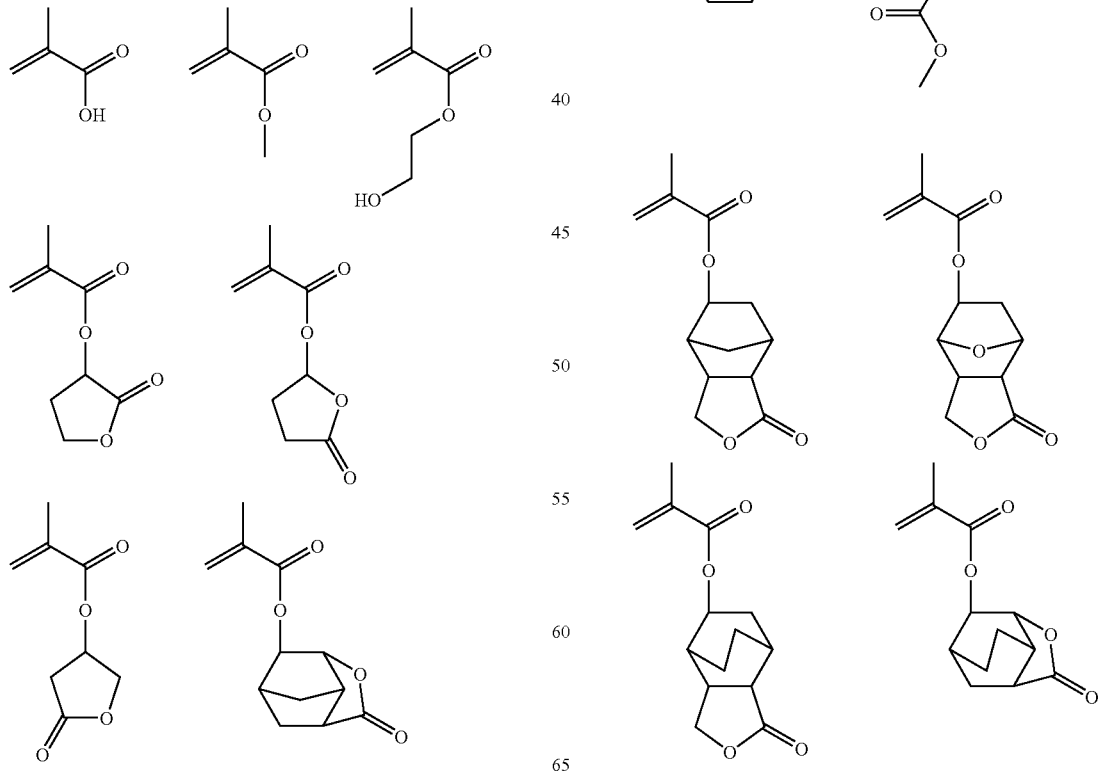
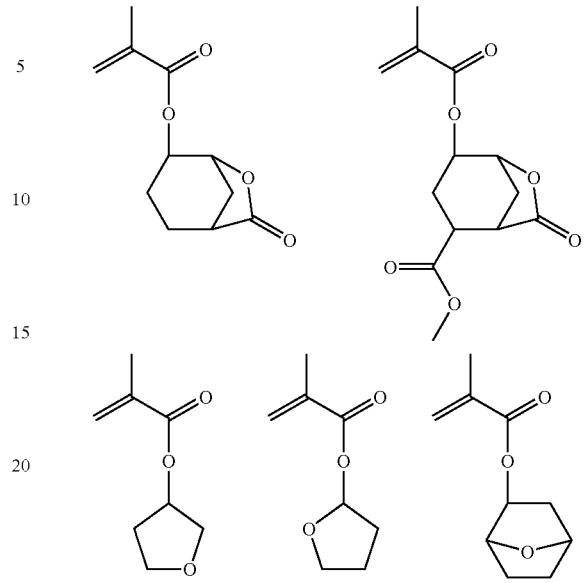

-continued
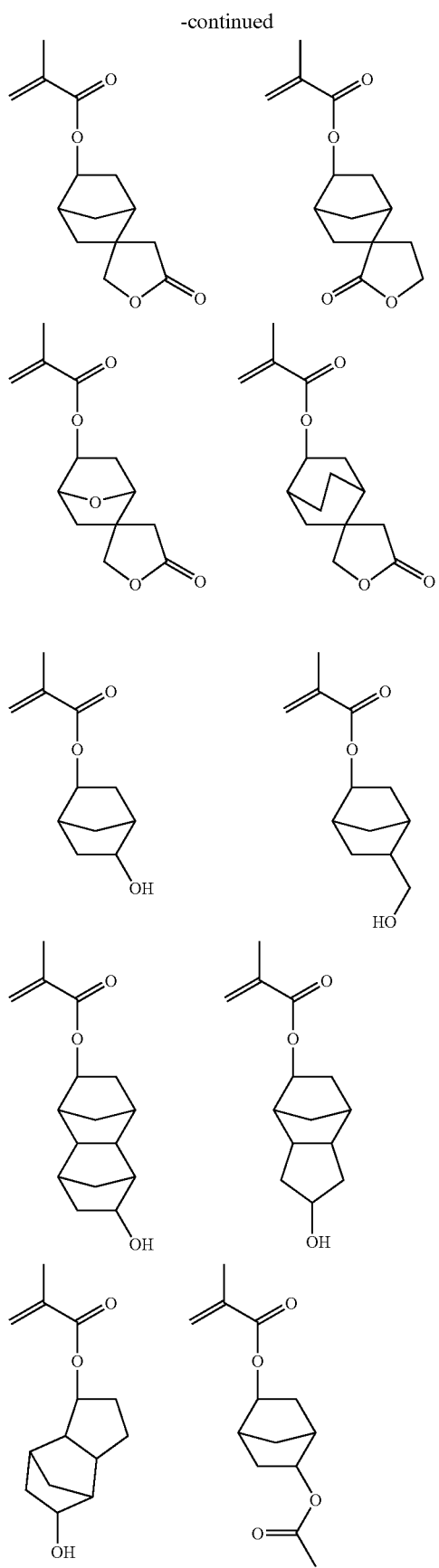
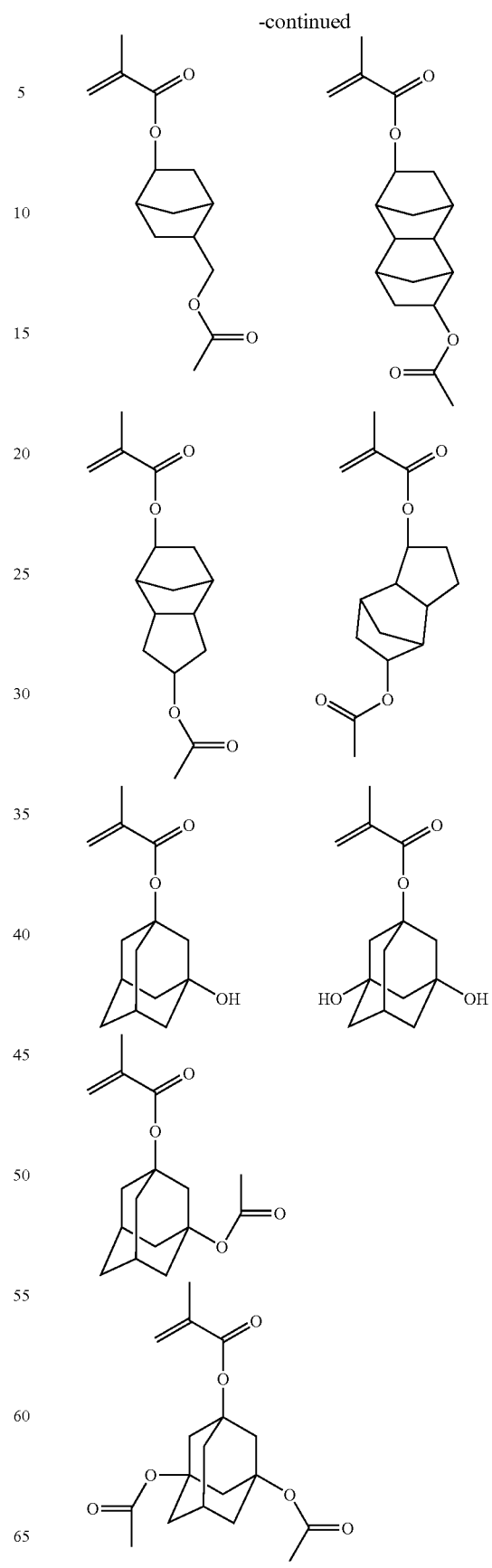

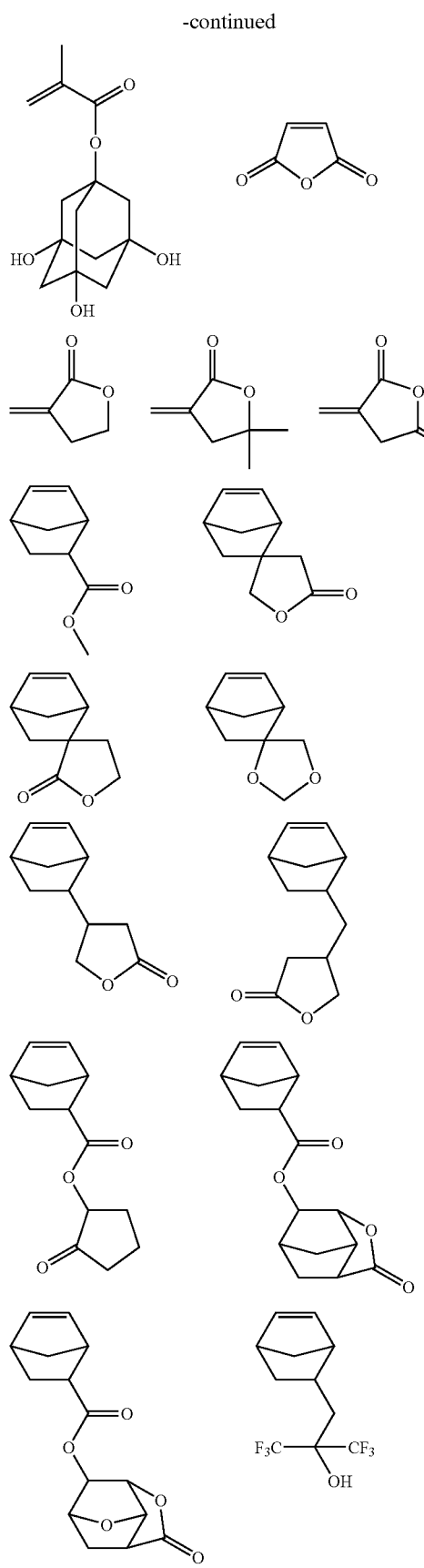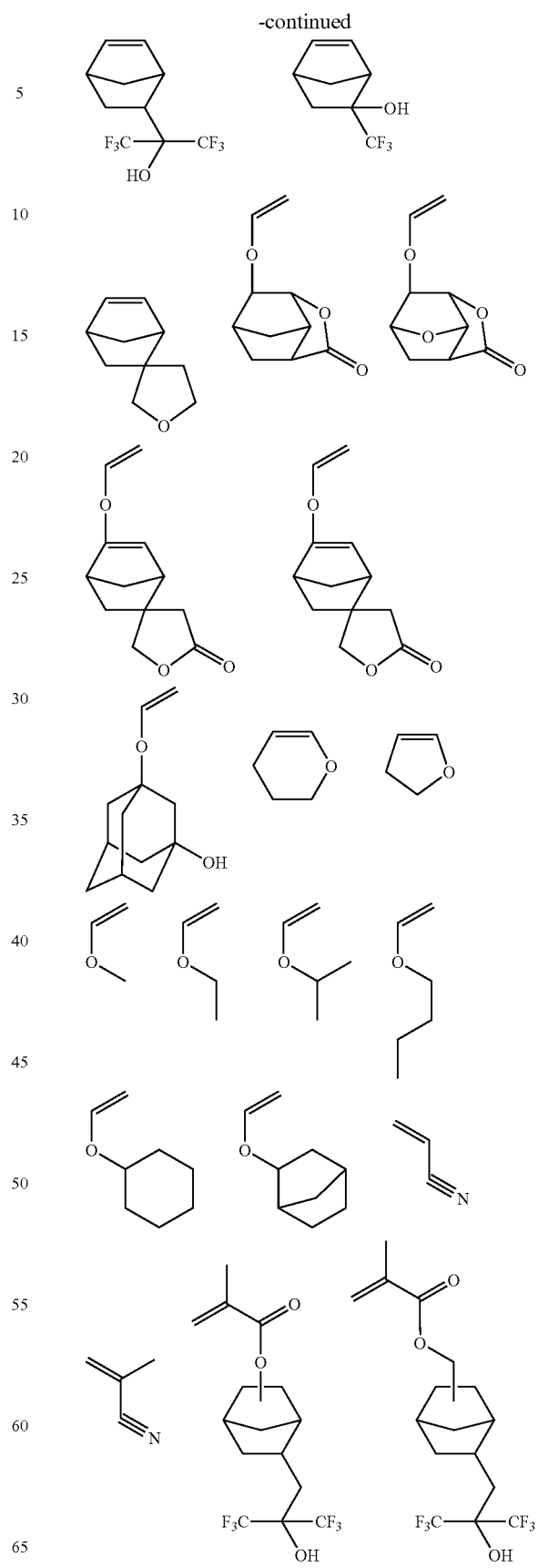

-continued
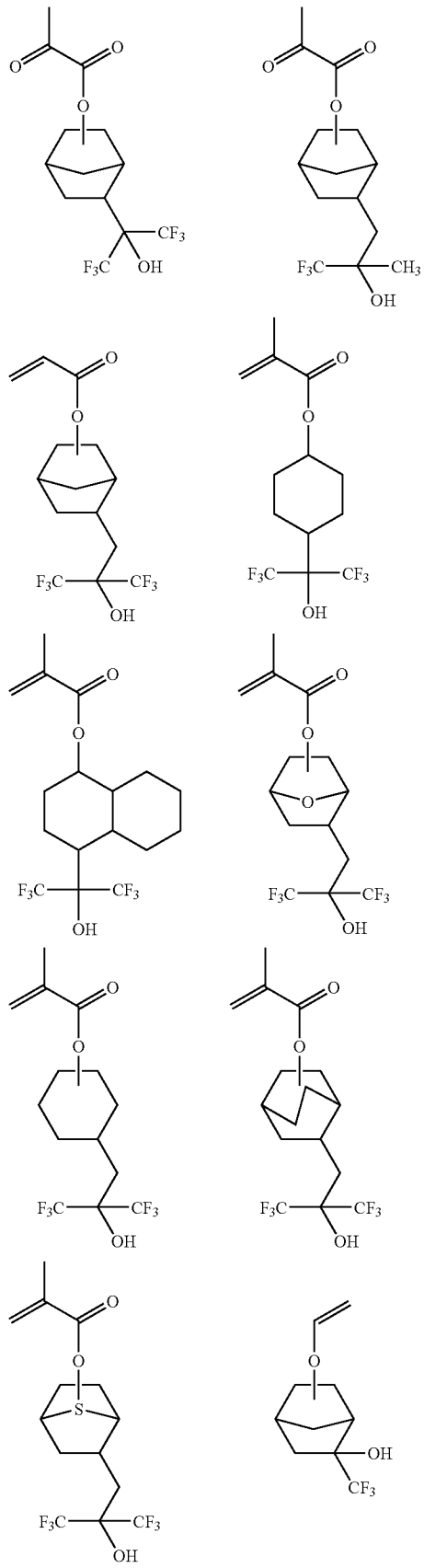
-continued
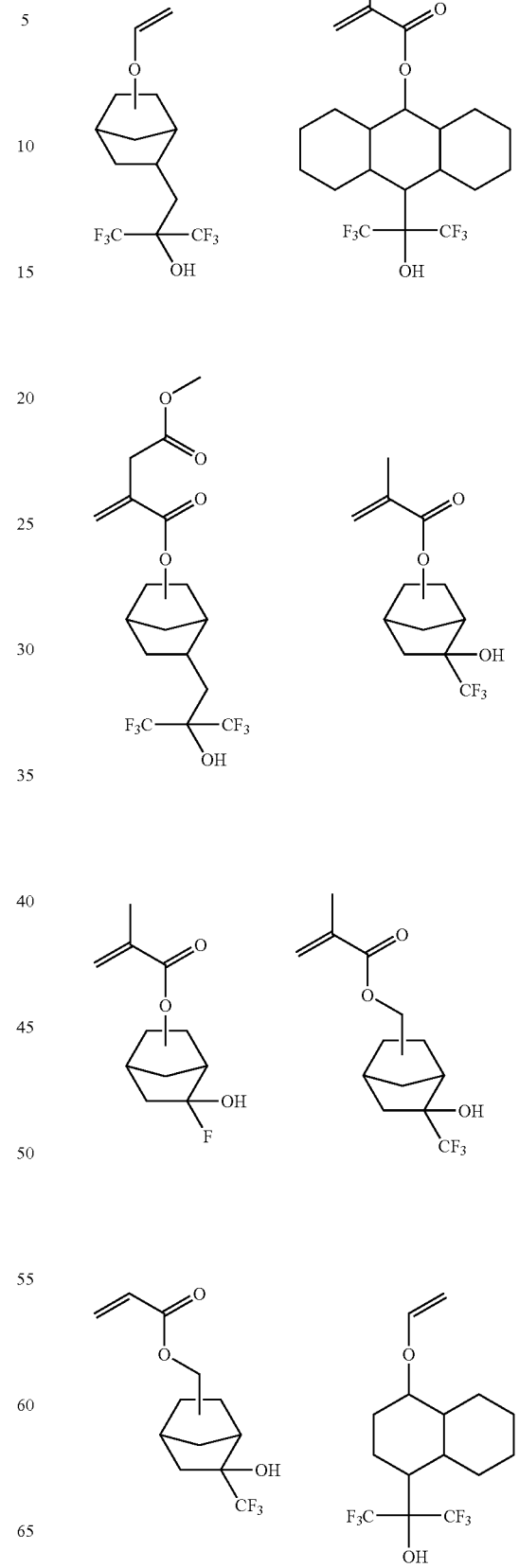

-continued

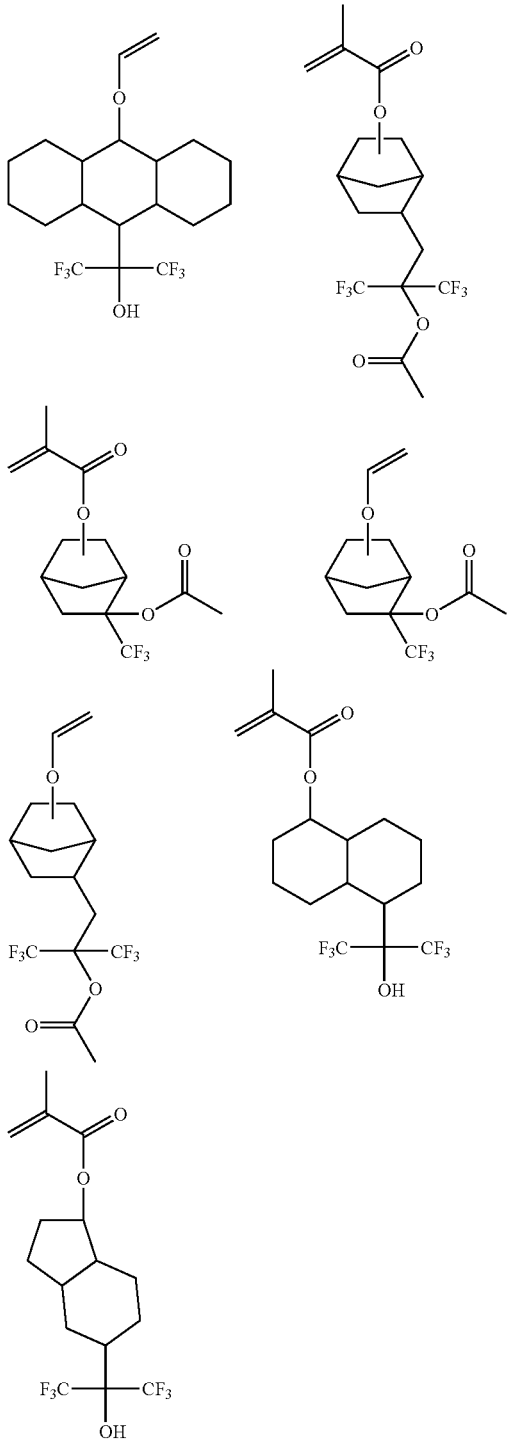

In the polymer of the invention, the units of formulae (1a), (2a) and (1b) are present in molar proportions a1, a2 and b1, respectively, which satisfy the following range:

0≦a1/(a1+a2+b1)≦0.9, preferably 0≦a1/(a1+a2+b1)≦0.8,

0≦a2/(a1+a2+b1)≦0.9, preferably 0≦a2/(a1+a2+b1)≦0.8,

0<(a1+a2)/(a1+a2+b1)<0.9, preferably 0.03≦(a1+a2)/(a1+a2+b1)≦0.8, and

0<b1/(a1+a2+b1)≦0.8, preferably 0.1≦b1/(a1+a2+b1)≦0.7.

Where units derived from the monomer of formula (1c) and units derived from the monomer (1d) are incorporated in molar proportions 1c and 1d, respectively, these proportions are preferably in the following range:

0≦1c/(a1+a2+b1+1c+1d)≦0.8, especially 0.1≦1c/(a1+a2+b1+1c+1d)≦0.7, and

0≦1d/(a1+a2+b1+1c+1d)≦0.7, especially 0.1≦1d/(a1+a2+b1+1c+1d)≦0.6.

It is understood that the relative proportions of recurring units of formulae (1a), (2a) and (1b) are the same whether the denominator is (a1+a2+b1) or (a1+a2+b1+1c+1d).

The polymer of the invention should preferably have a weight average molecular weight (Mw) in the range of 1,000 to 500,000, more preferably 2,000 to 30,000 as measured by gel permeation chromatography (GPC) using polystyrene standards. With too low a Mw, the resist composition may be less heat resistant. With too high a Mw, the resist composition may lose alkali solubility and give rise to a footing phenomenon after pattern formation.

If a polymer has a wide molecular weight distribution or dispersity (Mw/Mn), which indicates the presence of lower and higher molecular weight polymer components, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

The polymer of the invention may be synthesized by any desired method, for example, by dissolving unsaturated bond-containing monomers corresponding to the respective units of formulae (1a), (2a) and (1b) and optional monomers of formula (1c) or the like in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The acid labile group that has been incorporated in the monomers may be kept as such, or the acid labile group may be once removed with an acid catalyst and thereafter blocked or partially blocked.

The polymer of the invention can be formulated as the base resin into a resist composition, and especially chemical amplified positive working resist composition. It is understood that on use of the polymer as the base resin, a blend of two or more polymers which differ in compositional ratio, molecular weight distribution or molecular weight is acceptable.

In addition to the polymer, the positive resist composition of the invention may comprise an organic solvent, a compound capable of generating an acid in response to high-energy radiation (photoacid generator), and optionally, a dissolution inhibitor, a basic compound, a surfactant and other additives.

Solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone.

These solvents may be used alone or in combinations of two or more thereof. Of the above organic solvents, diethylene glycol dimethyl ether, 1-ethoxy-2-propanol and propylene glycol monomethyl ether acetate, and mixtures thereof are preferred because the photoacid generator is most soluble therein.

The organic solvent is preferably used in an amount of about 200 to 1,000 parts by weight, more preferably about 400 to 800 parts by weight per 100 parts by weight of the base resin.

Photoacid Generator

The photoacid generator is a compound capable of generating an acid upon exposure to high-energy radiation and includes the following:

(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.

(i) Onium Salts of Formula (P1a-1), (P1a-2) or (P1b):

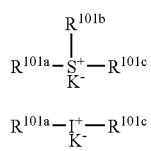

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are an alkylene group of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

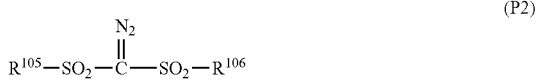

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

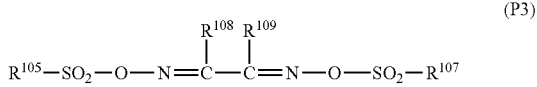

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are a straight or branched alkylene group of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

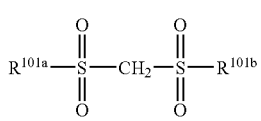

Herein, $R^{101a}$ and $R^{101b}$ are as defined above.

(v) Sulfonic Acid Esters of N-Hydroxyimide Compounds of Formula (P5)

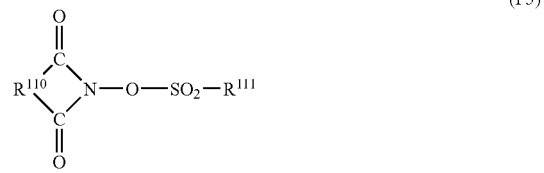

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the photoacid generator include:
onium salts such as
diphenyliodonium trifluoromethanesulfonate,
(p-tert-butoxyphenyl)phenyliodonium trifluoromethanesulfonate, diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate, tris(p-tert-butoxyphenyl)sulfonium trifluoromethane-sulfonate, triphenylsulfonium p-toluenesulfonate,
(p-tert-butoxyphenyl)diphenylsulfonium p-toluene-sulfonate,
bis(p-tert-butoxyphenyl)phenylsulfonium p-toluene-sulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluene-sulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoro-methanesulfonate,
ethylenebis[methyl(2-oxocyclopentyl)sulfonium trifluoro-methanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedionegly-oxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedionegly-oxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonyl-methane, bismethylsulfonylmethane, bisethylsulfonyl-methane, bispropylsulfonylmethane, bisisopropylsulfo-nylmethane, bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone deratives and dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methane-sulfonate,
N-hydroxy-5-norbornene-2,3-dicarboxyimide trifluoromethane-sulfonate, and
N-hydroxy-5-norbornene-2,3-dicarboxyimide p-toluene-sulfonate.

Preferred among these photoacid generators are onium salts such as triphenylsulfonium trifluoromethanesulfonate,
(p-tert-butoxyphenyl)diphenylsulfonium trifluoromethane-sulfonate,
tris(p-tert-butoxyphenyl)sulfonium trifluoromethane-sulfonate, triphenylsulfonium p-toluenesulfonate,
(p-tert-butoxyphenyl)diphenylsulfonium p-toluene-sulfonate,
tris(p-tert-butoxyphenyl)sulfonium p-toluenesulfonate, tri-naphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoro-methanesulfonate, and 1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 50 parts, and especially 0.5 to 40 parts by weight, per 100 parts by weight of the base resin. Less than 0.1 part of the photoacid generator may generate a less amount of acid upon exposure, sometimes leading to a poor sensitivity and resolution whereas more than 50 parts of the photoacid generator may adversely affect the transmittance and resolution of resist.

Dissolution Regulator

To the resist composition, a dissolution regulator or inhibitor may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

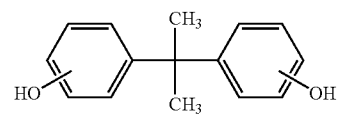
(D1)

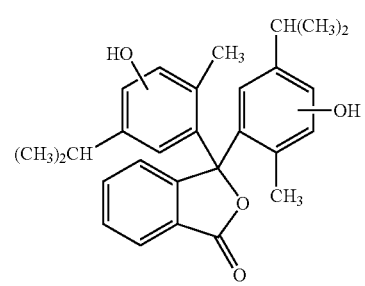
(D2)

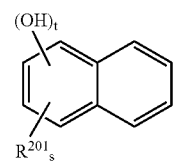
(D3)

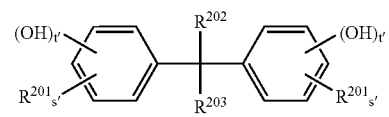
(D4)

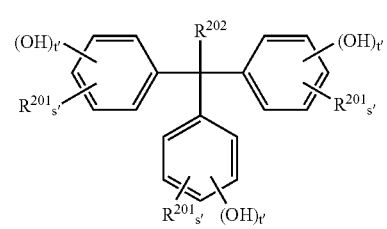
(D5)

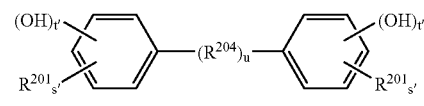
(D6)

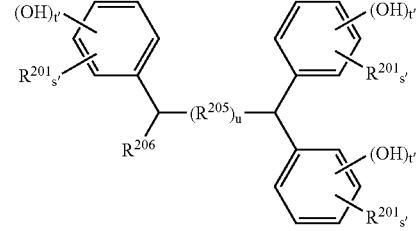
(D7)

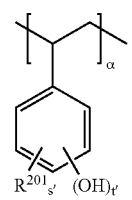
(D8)

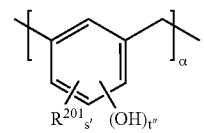
(D9)

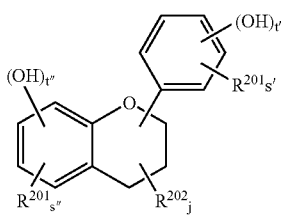 (D10)

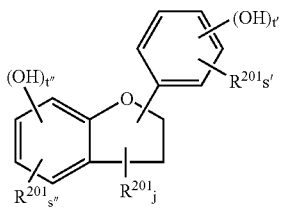 (D11)

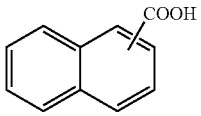 (D12)

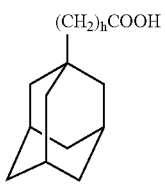 (D13)

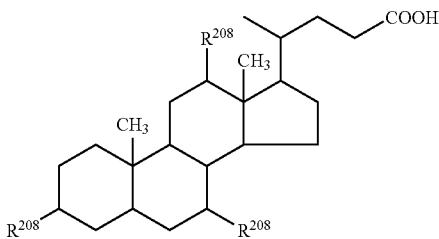 (D14)

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

The foregoing compounds should have a weight average molecular weight of from 100 to 1,000, preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. An appropriate amount of the dissolution inhibitor is effective for improving resolution whereas more than 50 parts would lead to slimming of the patterned film, and thus a decline in resolution.

Basic Compound

The basic compound used herein is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino- 1,2-propanediol, 3-pyrrolidino- 1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \quad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

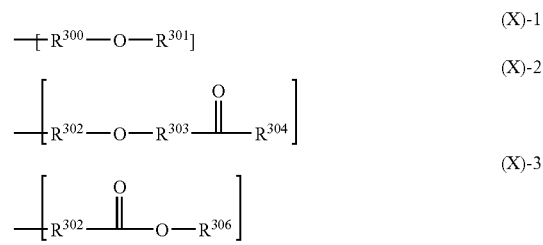

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4,1-aza-15-crown-5,1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl) ethylamine,
N,N-bis(2-acetoxyethyl)-2-(2-methoxyethoxycarbonyl) ethylamine,
N,N-bis(2-hydroxyethyl)-2-(2-hydroxyethoxycarbonyl) ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are basic compounds having cyclic structure, represented by the following general formula (B)-2.

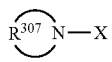

(B)-2

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate, 2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, basic compounds having cyano group, represented by the following general formulae (B)-3 to (B)-6 are useful.

(B)-3

(B)-4

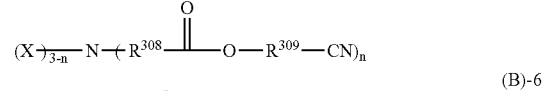

(B)-5

(B)-6

Herein, X, $R^{307}$ and n are as defined above, and $R^{308}$ and $R^{309}$ are each independently a straight or branched alkylene group of 1 to 4 carbon atoms.

Illustrative examples of the basic compounds having cyano group, represented by formulae (B)-3 to (B)-6, include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile, N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compound is preferably formulated in an amount of 0.001 to 2 parts, and especially 0.01 to 1 part by weight, per 100 parts by weight of the entire base resin. Less than 0.001 part of the basic compound achieves no or little addition effect whereas more than 2 parts would result in too low a sensitivity.

Other Components

In the positive resist composition, a compound having a group ≡C—COOH may be blended. Exemplary, non-limiting compounds having a carboxyl group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

(A1)

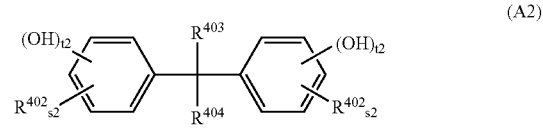

(A2)

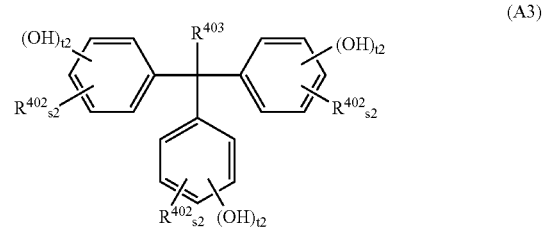

(A3)

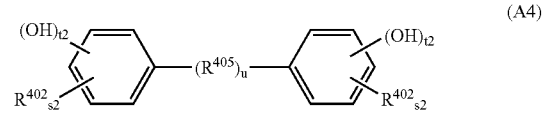

(A4)

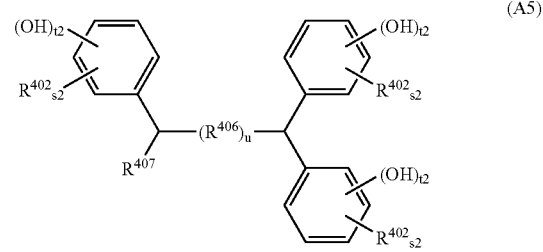

(A5)

(A6)

-continued (A7)

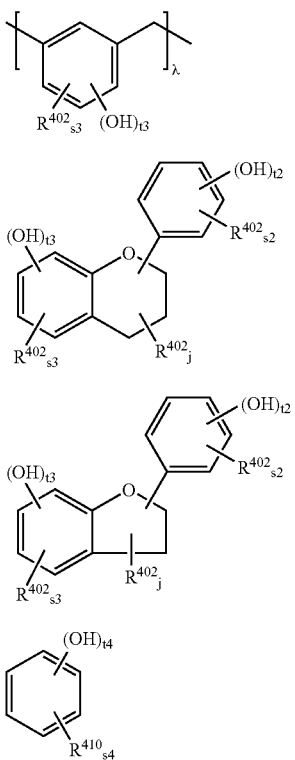

(A8)

(A9)

(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:
Compounds of general formulas (A11) to (A15) below.

(A11)

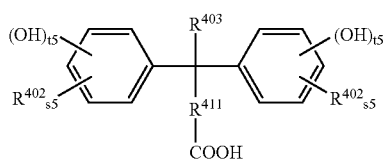

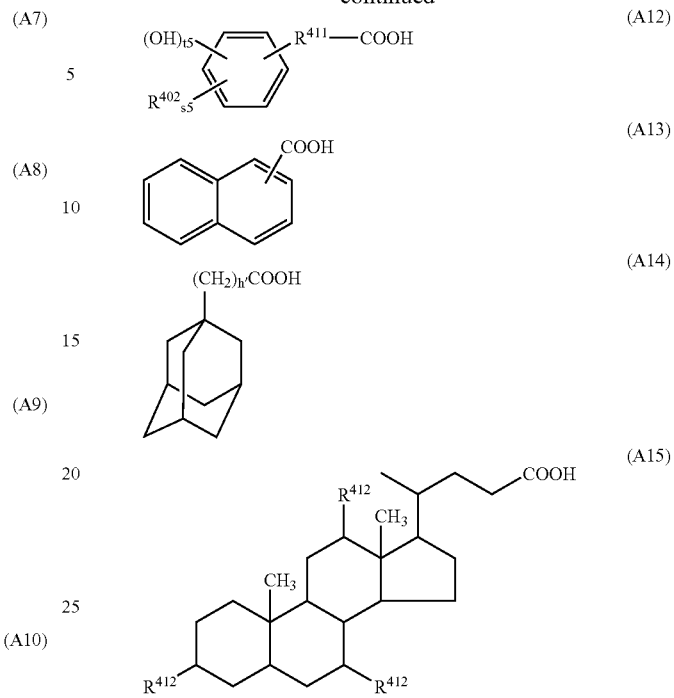

(A12)

(A13)

(A14)

(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 or 1.

Illustrative, non-limiting examples of the compound having a carboxyl group include compounds of the general formulas AI-1 to AI-14 and AII-1 to AII-10 below.

(AI-1)

(AI-2)

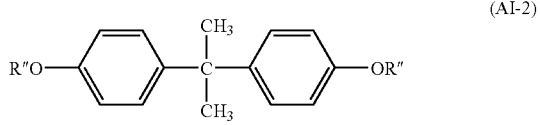

(AI-3)

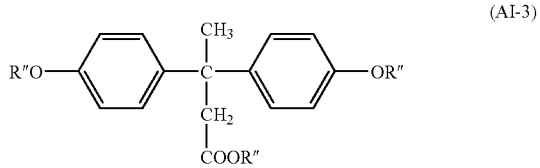

(AI-4)

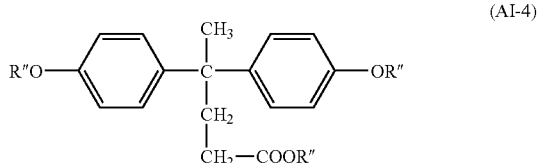

(AI-5)

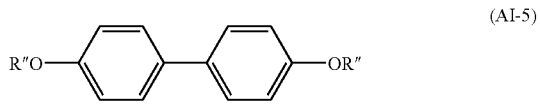

-continued
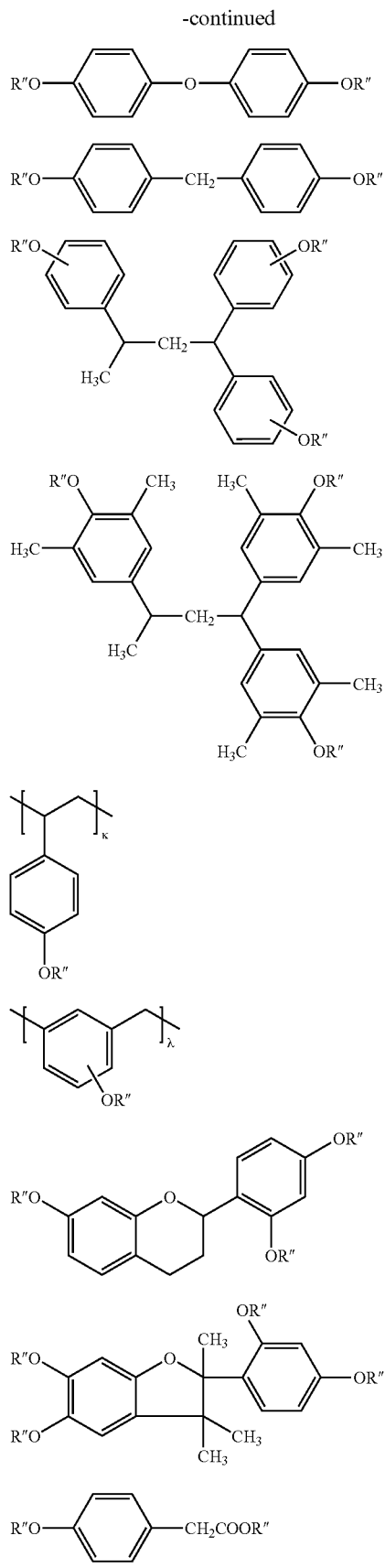
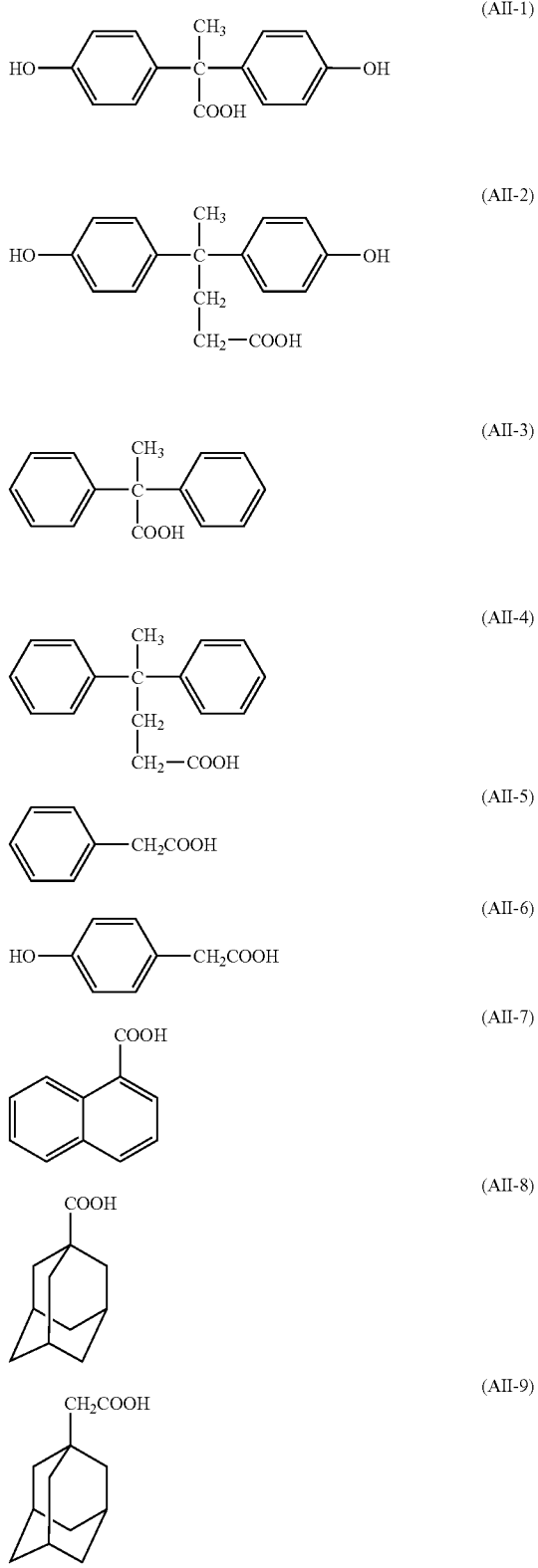
In the above formulas, R'' is hydrogen or a —CH₂COOH group such that the —CH₂COOH group accounts for 10 to 100 mol % of R'' in each compound, K and X are as defined above.

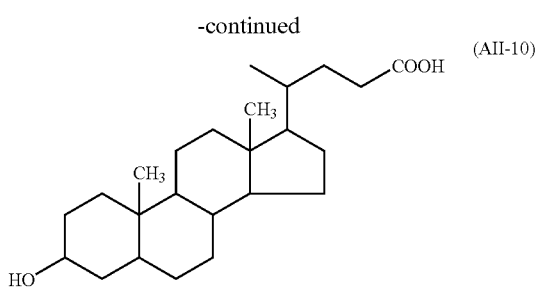
(AII-10)

The compound having a group ≡C—COOH may be used singly or as combinations of two or more thereof. The compound is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The positive resist composition of the invention may further include a surfactant which is commonly used for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

For the microfabrication of integrated circuits, any well-known lithography may be used to form a resist pattern from the positive resist composition of the invention although the technology is not limited thereto.

The composition is applied onto a substrate (on which an integrated circuit is to be formed, e.g., Si, $SiO_2$, SiN, SiON, TiN, WSi, BPSG, SOG, organic antireflective film, Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation such as UV, deep-UV, electron beams, x-rays, excimer laser light, γ-rays and synchrotron radiation, preferably having an exposure wavelength of up to 300 nm, more preferably 180 to 200 nm. The exposure dose is preferably about 1 to 200 mJ/cm², more preferably about 10 to 100 mJ/cm². The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate. It is appreciated that the resist composition of the invention is suited for micro-patterning using such high-energy radiation as deep UV with a wavelength of 254 to 193 nm, vacuum UV with a wavelength of 157 nm, electron beams, soft x-rays, x-rays, excimer laser light, γ-rays and synchrotron radiation, and best suitable for micro-patterning using high-energy radiation in the wavelength range of 180 to 200 nm.

Immersion lithography can be applied to the resist composition of the invention. The ArF immersion lithography uses deionized water as the immersion solvent. The immersion lithography involves prebaking a resist film and exposing the resist film to light through a projection lens, with water interposed between the resist film and the projection lens. Since water has a refractive index of 1.43 at the wavelength 193 nm, the exposure wavelength is 135 nm=193/1.43, indicating that the exposure wavelength can be shortened. Therefor, this technology is important for the ArF lithography to survive to the 65 nm node, with a further development thereof being accelerated. The lactone ring, which is used as a hydrophilic group in the prior art ArF resists, has solubility in both alkaline aqueous solution and water. When lactones and acid anhydrides (e.g., maleic anhydride and itaconic anhydride) having high solubility in water are used as the hydrophilic group, a problem arises during immersion in water that more water penetrates into the resist from its surface, whereby the resist surface is swollen. By contrast, hexafluoroalcohol is dissolvable in alkaline aqueous solution, but not at all in water, and it is thus believed that the influence of dissolution and swelling during liquid immersion is minimized.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, Mn for number average molecular weight, Mw/Mn for molecular weight distribution or dispersity, and PGMEA for propylene glycol monomethylether acetate. For all polymers, Mw and Mn are determined by GPC versus polystyrene standards.

Synthesis Example 1

A 100-mL flask was charged with 8.2 g of 3-ethyl-3-exo-tetracyclo[4.4.0.1$^{2,5}$.1$^{7,10}$]dodecanyl methacrylate, 9.2 g of 3-oxo-2,7-dioxatricyclo[4.2.1.0$^{4,8}$]nonan-9-yl methacrylate, 14.8 g of 2-(2-hydroxy-1,1,1,3,3,3-hexafluoro-2-propyl)-cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 25.8 g of a white polymer.

The polymer was analyzed by $^{13}$C-NMR, $^1$H-NMR, and GPC, with the results shown below.

Copolymer Composition Ratio (Molar Ratio)
3-ethyl-3-exo-tetracyclo[4.4.0.1$^{2,5}$.1$^{7,10}$]dodecanyl methacrylate:3-oxo-2,7-dioxatricyclo[4.2.1.0$^{4,8}$]nonan-9-yl methacrylate:2-(2-hydroxy-1,1,1,3,3,3-hexafluoro-2-propyl)cyclohexyl methacrylate=0.30:0.40:0.30
Mw=8,200
Mw/Mn=1.78

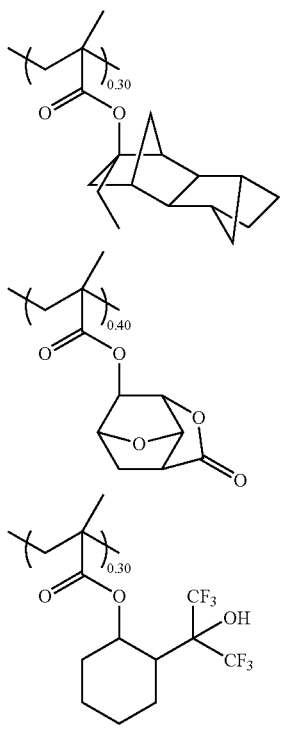

This polymer is designated Inventive Polymer 1.

Synthesis Example 2

A 100-mL flask was charged with 9.8 g of 2-ethyl-2-adamantane methacrylate, 8.2 g of 3-hydroxy-1-adamantyl methacrylate, 5.3 g of 3-oxo-2,7-dioxatricyclo[4.2.1.0$^{4,8}$]-nonan-9-yl methacrylate, 5.0 g of 3,5-di(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^1$H-NMR, and GPC, with the results shown below.

Copolymer Composition Ratio (Molar Ratio)
2-ethyl-2-adamantane methacrylate:3-hydroxy-1-adamantyl methacrylate:3-oxo-2,7-dioxatricyclo-[4.2.1.0$^{4,8}$]nonan-9-yl methacrylate:3,5-di(2-hydroxy-1,1,1,3,3,3-hexafluoro-2-propyl)cyclohexyl methacrylate=0.35:0.30:0.25:0.10
Mw=8,600
Mw/Mn=1.88

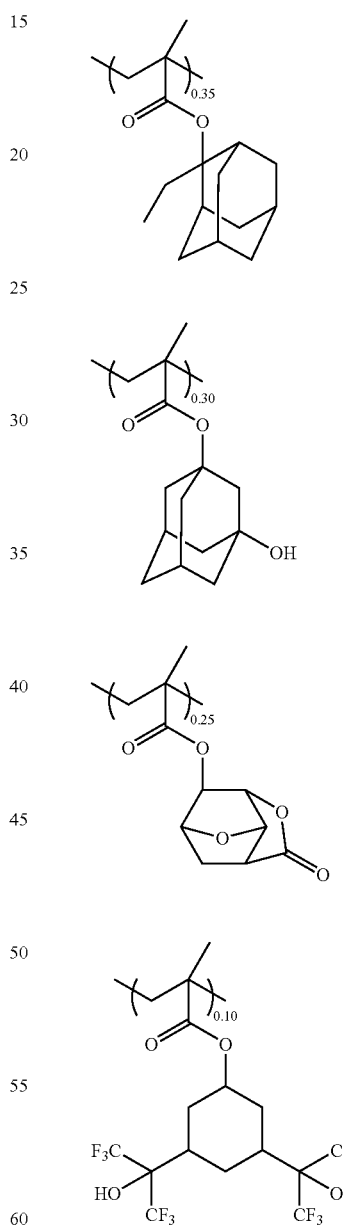

This polymer is designated Inventive Polymer 2.

Synthesis Example 3

A 100-mL flask was charged with 9.8 g of 2-ethyl-2-adamantane methacrylate, 8.8 g of 3-hydroxy-1-adamantyl methacrylate, 10.2 g of 3-oxo-5-methoxycarbonyl-2-oxatricyclo[4.2.1.0$^{4,8}$]-9-nonyl methacrylate, 5.0 g of 3,5-di(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^1$H-NMR, and GPC, with the results shown below.

Copolymer Composition Ratio (Molar Ratio)

2-ethyl-2-adamantane methacrylate:3-hydroxy-1-adamantyl methacrylate:3-oxo-5-methoxycarbonyl-2-oxatricyclo[4.2.1.0$^{4,8}$]-9-nonyl methacrylate:3,5-di(2-hydroxy-1,1,1,3,3,3-hexafluoro-2-propyl)cyclohexyl methacrylate=0.35:0.30:0.25:0.10

Mw=8,900
Mw/Mn=1.83

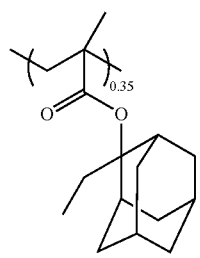

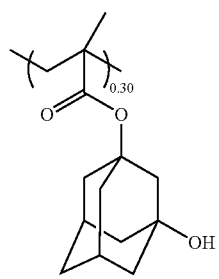

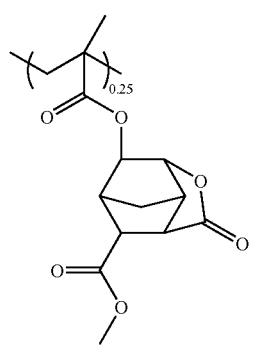

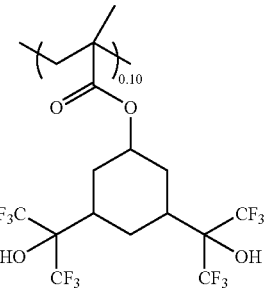

This polymer is designated Inventive Polymer 3.

Synthesis Example 4

A 100-mL flask was charged with 9.8 g of 2-ethyl-2-adamantane methacrylate, 8.2 g of 3-hydroxy-1-adamantyl methacrylate, 5.3 g of 3-oxo-2,7-dioxatricyclo[4.2.1.0$^{4,8}$]-nonan-9-yl methacrylate, 8.0 g of 2-(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^1$H-NMR, and GPC, with the results shown below.

Copolymer Composition Ratio (Molar Ratio)

2-ethyl-2-adamantane methacrylate:3-hydroxy-1-adamantyl methacrylate:3-oxo-2,7-dioxatricyclo-[4.2.1.0$^{4,8}$] nonan-9-yl methacrylate:2-(2-hydroxy-1,1,1,3,3,3-hexafluoro-2-propyl)cyclohexyl methacrylate=0.35:0.20:0.20:0.25

Mw=9,200
Mw/Mn=1.81

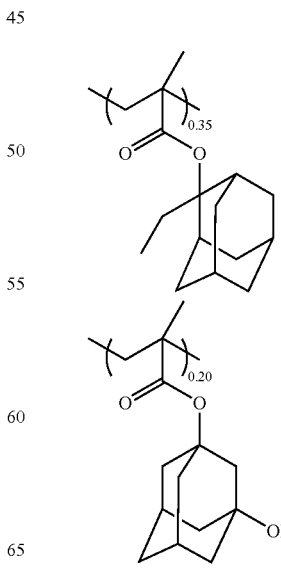

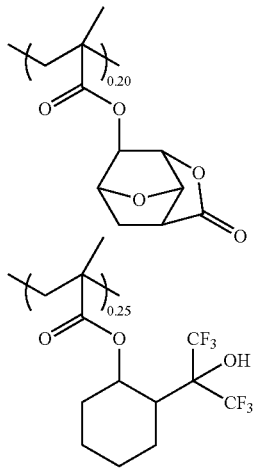

This polymer is designated Inventive Polymer 4.

Synthesis Example 5

A 100-mL flask was charged with 11.8 g of 1-cyclopentylcyclohexyl methacrylate, 8.2 g of 3-hydroxy-1-adamantyl methacrylate, 5.3 g of 3-oxo-2,7-dioxatricyclo[4.2.1.0$^{4,8}$]nonan-9-yl methacrylate, 5.0 g of 3,5-di(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^{1}$H-NMR, and GPC, with the results shown below.

Copolymer Composition Ratio (Molar Ratio)

1-cyclopentylcyclohexyl methacrylate:3-hydroxy-1-adamantyl methacrylate:3-oxo-2,7-dioxatricyclo-[4.2.1.0$^{4,8}$]nonan-9-yl methacrylate:3,5-di(2-hydroxy-1,1,1,3,3,3-hexafluoro-2-propyl)cyclohexyl methacrylate=0.22:0.30:0.38:0.10

Mw=7,800
Mw/Mn=1.73

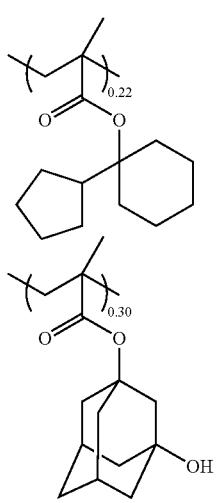

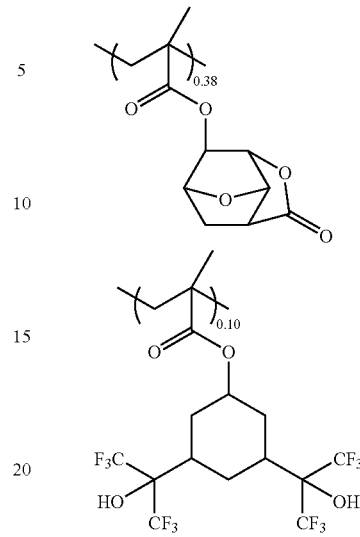

This polymer is designated Inventive Polymer 5.

Synthesis Example 6

A 100-mL flask was charged with 8.6 g of 1-ethylcyclopentyl methacrylate, 8.2 g of 3-hydroxy-1-adamantyl methacrylate, 5.3 g of 3-oxo-2,7-dioxatricyclo-[4.2.1.0$^{4,8}$]nonan-9-yl methacrylate, 5.0 g of 3,5-di(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^{1}$H-NMR, and GPC, with the results shown below.

Copolymer Composition Ratio (Molar Ratio)

1-ethylcyclopentyl methacrylate:3-hydroxy-1-adamantyl methacrylate:3-oxo-2,7-dioxatricyclo[4.2.1.0$^{4,8}$]nonan-9-yl methacrylate:3,5-di(2-hydroxy-1,1,1,3,3,3-hexafluoro-2-propyl)cyclohexyl methacrylate=0.33:0.30:0.27:0.10

Mw=7,200
Mw/Mn=1.76

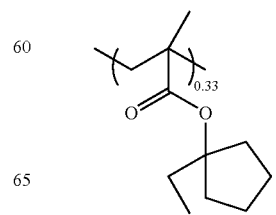

-continued

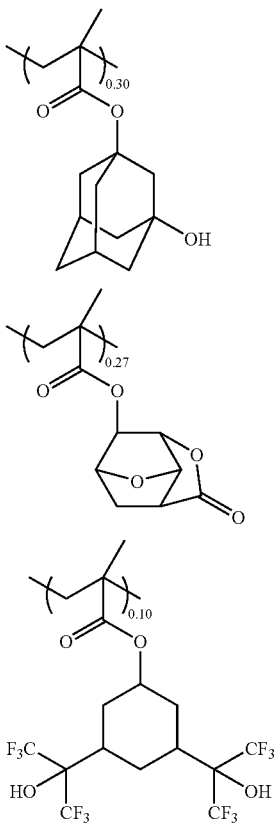

This polymer is designated Inventive Polymer 6.

Synthesis Example 7

A 100-mL flask was charged with 10.5 g of 1-(7-oxanor-bornan-2-yl)cyclopentyl methacrylate, 8.2 g of 3-hydroxy-1-adamantyl methacrylate, 5.3 g of 3-oxo-2,7-dioxatricyclo[4.2.1.0$^{4,8}$]nonan-9-yl methacrylate, 5.0 g of 3,5-di(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^{1}$H-NMR, and GPC, with the results shown below.

Copolymer Composition Ratio (Molar Ratio)

1-(7-oxanorbornan-2-yl)cyclopentyl methacrylate 3-hydroxy-1-adamantyl methacrylate:3-oxo-2,7-dioxatricyclo[4.2.1.0$^{4,8}$]nonan-9-yl methacrylate:3,5-di(2-hydroxy-1,1,1,3,3,3-hexafluoro-2-propyl)-cyclohexyl methacrylate=0.25:0.30:0.35:0.10

Mw=7,800
Mw/Mn=1.88

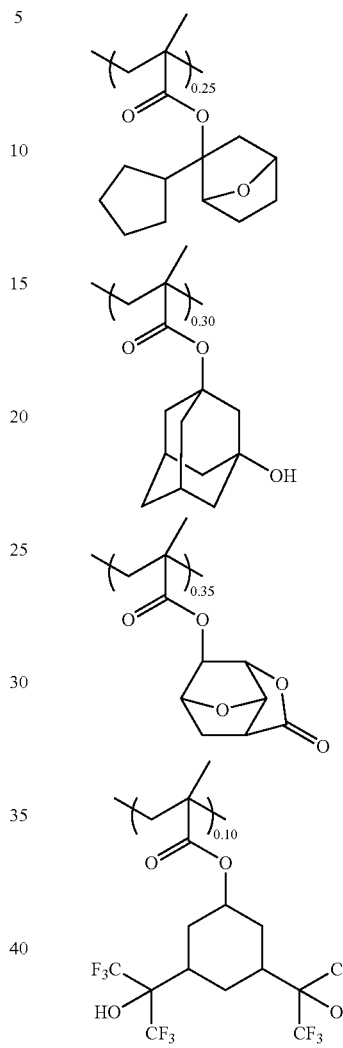

This polymer is designated Inventive Polymer 7.

Synthesis Example 8

A 100-mL flask was charged with 7.9 g of 2-adamantyloxymethyl methacrylate, 8.2 g of 3-hydroxy-1-adamantyl methacrylate, 5.3 g of 3-oxo-2,7-dioxa-tricyclo[4.2.1.0$^{4,8}$] nonan-9-yl methacrylate, 5.0 g of 3,5-di(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.3 g of a white polymer.

The polymer was analyzed by $^{13}$C-NMR, $^{1}$H-NMR, and GPC, with the results shown below.

Copolymer Composition Ratio (Molar Ratio)

2-adamantyloxymethyl methacrylate:3-hydroxy-1-adamantyl methacrylate:3-oxo-2,7-dioxatricyclo-[4.2.1.0$^{4,8}$] nonan-9-yl methacrylate:3,5-di(2-hydroxy-1,1,1,3,3,3-hexafluoro-2-propyl)cyclohexyl methacrylate=0.21:0.30: 0.41:0.08

Mw=9,100
Mw/Mn=1.83

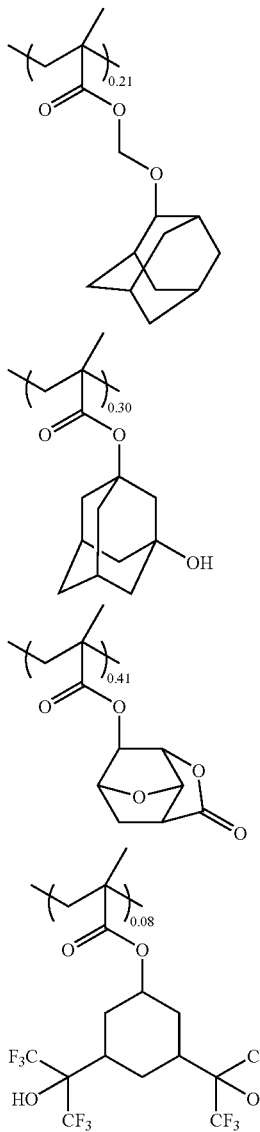

This polymer is designated Inventive Polymer 8.

Comparative Synthesis Example 1

A 100-mL flask was charged with 24.4 g of 2-ethyl-2-adamantane methacrylate, 17.1 g of γ-butyrolactone methacrylate, and 40 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 36.1 g of a white polymer.

The polymer was analyzed by $^{13}$C-NMR, $^1$H-NMR, and GPC, with the results shown below.

Copolymer Composition Ratio (Molar Ratio)

2-ethyl-2-adamantane methacrylate:γ-butyrolactone methacrylate=0.48:0.52

Mw=12,500
Mw/Mn=1.88

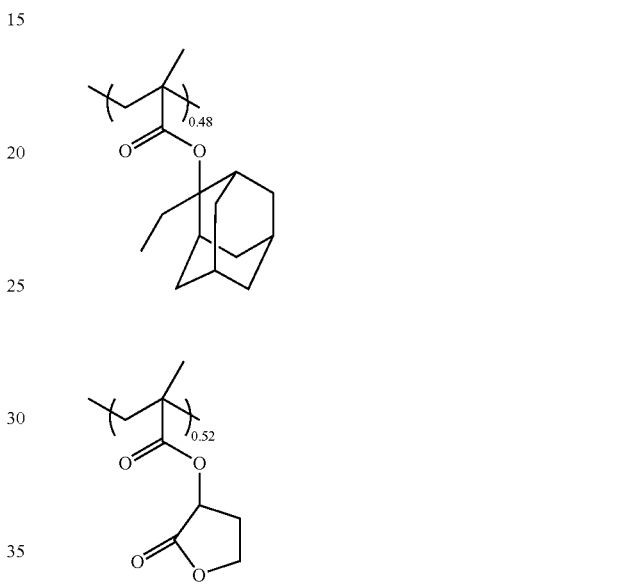

This polymer is designated Comparative Polymer 1.

Comparative Synthesis Example 2

A 100-mL flask was charged with 8.7 g of 2-(2-methoxymethoxy-1,1,1,3,3,3-hexafluoro-2-propyl)-cyclohexyl methacrylate, 25.7 g of 2-(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 20.3 g of a white polymer.

The polymer was analyzed by $^{13}$C-NMR, $^1$H-NMR, and GPC, with the results shown below.

Copolymer Composition Ratio (Molar Ratio)

2-(2-methoxymethoxy-1,1,1,3,3,3-hexafluoro-2-propyl) cyclohexyl methacrylate:2-(2-hydroxy-1,1,1,3,3,3-hexafluoro-2-propyl)cyclohexyl methacrylate=0.77:0.23

Mw=6,700
Mw/Mn=1.56

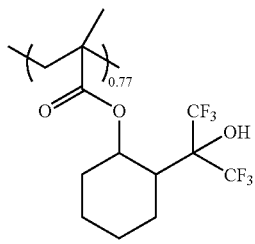

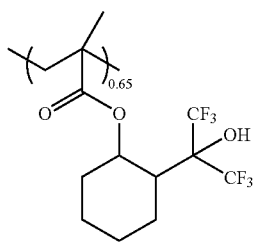

This polymer is designated Comparative Polymer 2.

Comparative Synthesis Example 3

A 100-mL flask was charged with 8.6 g of 2-ethyl-2-adamantane methacrylate, 30.3 g of 2-(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 28.3 g of a white polymer.

The polymer was analyzed by $^{13}$C-NMR, $^{1}$H-NMR, and GPC, with the results shown below.

Copolymer Composition Ratio (Molar Ratio)
2-ethyl-2-adamantane methacrylate:2-(2-hydroxy-1,1,1,3,3,3-hexafluoro-2-propyl)cyclohexyl methacrylate 0.35:0.65
Mw=7,800
Mw/Mn=1.66

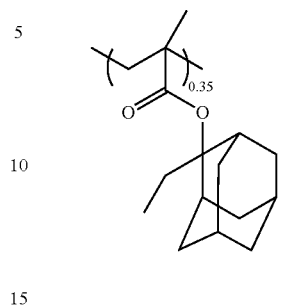

This polymer is designated Comparative Polymer 3.

Comparative Synthesis Example 4

A 100-mL flask was charged with 11.8 g of 3,5-di(2-methoxymethoxy-1,1,1,3,3,3-hexafluoro-2-propyl)cyclohexyl methacrylate, 35.6 g of 2-(2-hydroxy-1,1,1,3,3,3-hexafluoro-2-propyl)cyclohexyl methacrylate, and 20 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 32.3 g of a white polymer.

The polymer was analyzed by $^{13}$C-NMR, $^{1}$H-NMR, and GPC, with the results shown below.

Copolymer Composition Ratio (Molar Ratio)

3,5-di(2-methoxymethoxy-1,1,1,3,3,3-hexafluoro-2-propyl)cyclohexyl methacrylate:2-(2-hydroxy-1,1,1,3,3,3-hexafluoro-2-propyl)cyclohexyl methacrylate=0.20:0.80
Mw=6,800
Mw/Mn=1.55

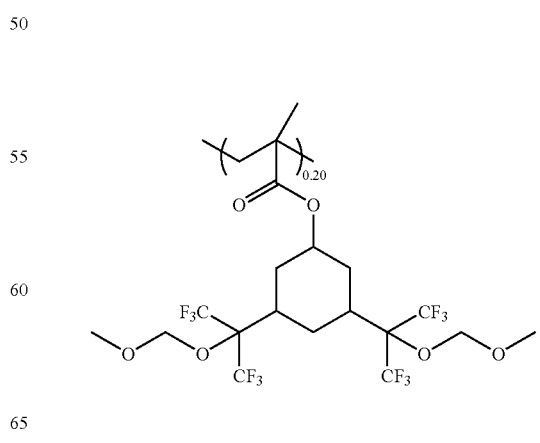

-continued

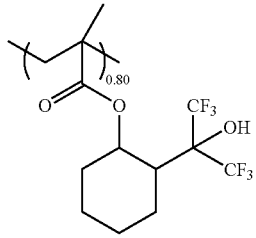

This polymer is designated Comparative Polymer 4.

Examples and Comparative Examples

Preparation of Positive Resist Compositions

Resist solutions were prepared by dissolving the polymer and other components in a solvent in accordance with the formulation shown in Table 1 and passing through a filter with a pore size of 0.2 μm. The components in Table 1 are as follows.

Polymer:
  Inventive Polymers 1 to 8 resulting from Synthesis Examples 1 to 8
  Comparative Polymers 1 to 4 resulting from Comparative Synthesis Examples 1 to 4

Photoacid generator:
  PAG1 of the following structural formula

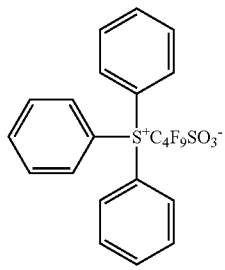

PAG1

Basic compound:
  triethanolamine, TMMEA, AAA, and AACN of the following structural formulae

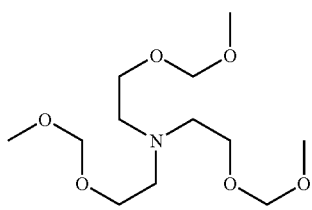

TMMEA

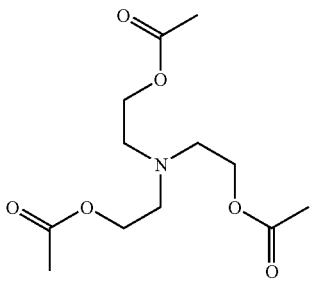

AAA

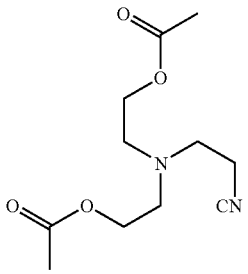

AACN

Dissolution inhibitor:
  DRI1 of the following structural formula

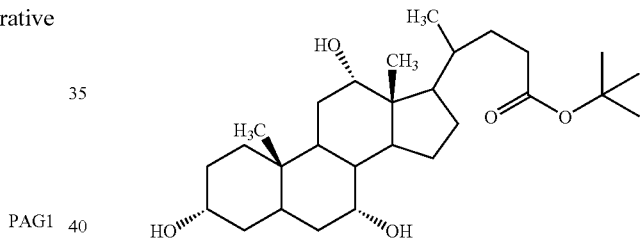

DRI1

Organic solvent:
  PGMEA

Exposure/patterning
  On silicon wafers having a film of AR-19 (Shipley) coated to a thickness of 82 nm, the resist solutions were spin coated, then baked on a hot plate at 120° C. for 60 seconds to give resist films having a thickness of 250 nm.
  The resist films were exposed by means of an ArF excimer laser stepper model NSR-S305B (Nikon Corp., NA 0.68, σ 0.85, ⅔ annular illumination). Immediately exposure, the resist films were baked (PEB) at 110° C. for 60 seconds and then developed for 60 seconds with a 2.38% aqueous solution of tetramethylammonium hydroxide, obtaining positive patterns.
  The resist patterns were evaluated. The exposure dose (mJ/cm$^2$) which provided a 1:1 resolution to a 0.12-μm line-and-space pattern was the sensitivity. The minimum line width (nm) of a L/S pattern which was ascertained separate at this dose was the resolution of a test resist. Using a measuring SEM model S-9220 (Hitachi Ltd.), the 0.12-μm L/S pattern was measured for line edge roughness. A cross section of the resist was observed under a SEM model S4200 (Hitachi Ltd.). The results are also shown in Table 1.

TABLE 1

|  | Polymer (pbw) | Photoacid generator (pbw) | Basic compound (pbw) | Dissolution inhibitor (pbw) | Solvent (pbw) | Sensitivity (mJ/cm$^2$) | Resolution (μm) | Pattern profile | Line edge roughness (3σ, nm) |
|---|---|---|---|---|---|---|---|---|---|
| Example 1 | Inventive Polymer 1 (100) | PAG1 (2.5) | triethanolamine (0.25) | — | PGMEA (800) | 32 | 0.11 | rectangular | 7.2 |
| Example 2 | Inventive Polymer 2 (100) | PAG1 (2.5) | triethanolamine (0.25) | — | PGMEA (800) | 31 | 0.11 | rectangular | 6.1 |
| Example 3 | Inventive Polymer 3 (100) | PAG1 (2.5) | triethanolamine (0.25) | — | PGMEA (800) | 35 | 0.10 | rectangular | 7.8 |
| Example 4 | Inventive Polymer 4 (100) | PAG1 (2.5) | triethanolamine (0.25) | — | PGMEA (800) | 31 | 0.10 | rectangular | 7.6 |
| Example 5 | Inventive Polymer 5 (100) | PAG1 (2.5) | triethanolamine (0.25) | — | PGMEA (800) | 22 | 0.11 | rectangular | 7.9 |
| Example 6 | Inventive Polymer 6 (100) | PAG1 (2.5) | triethanolamine (0.25) | — | PGMEA (800) | 26 | 0.10 | rectangular | 7.2 |
| Example 7 | Inventive Polymer 7 (100) | PAG1 (2.5) | triethanolamine (0.25) | — | PGMEA (800) | 28 | 0.10 | rectangular | 6.9 |
| Example 8 | Inventive Polymer 8 (100) | PAG1 (2.5) | triethanolamine (0.25) | — | PGMEA (800) | 20 | 0.11 | rectangular | 6.8 |
| Example 9 | Inventive Polymer 2 (100) | PAG1 (2.5) | TMMEA (0.4) | — | PGMEA (800) | 36 | 0.10 | rectangular | 6.5 |
| Example 10 | Inventive Polymer 2 (100) | PAG1 (2.5) | AAA (0.4) | — | PGMEA (800) | 36 | 0.10 | rectangular | 6.8 |
| Example 11 | Inventive Polymer 2 (100) | PAG1 (2.5) | AACN (0.4) | — | PGMEA (800) | 36 | 0.10 | rectangular | 6.8 |
| Example 12 | Inventive Polymer 2 (100) | PAG1 (2.5) | triethanolamine (0.25) | DRI1 (10) | PGMEA (800) | 28 | 0.11 | rectangular | 6.3 |
| Comparative Example 1 | Comparative Polymer 1 (100) | PAG1 (2.5) | triethanolamine (0.25) | — | PGMEA (800) | 28 | 0.12 | rectangular | 10.5 |
| Comparative Example 2 | Comparative Polymer 2 (100) | PAG1 (2.2) | triethanolamine (0.25) | — | PGMEA (800) | — | not resolved | — | — |
| Comparative Example 3 | Comparative Polymer 3 (100) | PAG1 (2.2) | triethanolamine (0.25) | — | PGMEA (800) | 18 | 0.12 | tapered | 12.8 |
| Comparative Example 4 | Comparative Polymer 4 (100) | PAG1 (2.2) | triethanolamine (0.25) | — | PGMEA (800) | 15 | 0.12 | triangular | 11.5 |

It is evident from Table 1 that the resist compositions of Examples 1 to 12, when processed through ArF exposure, demonstrate a high sensitivity, an excellent resolution, and minimized line edge roughness.

Dissolution Behavior of Resist in Developer as Analyzed by QCM

The above-prepared resist solution (Example 1 or Comparative Example 1) was passed through a filter having a pore size of 0.2 μm, spin coated on a quartz substrate with a size of 1 inch (~25 mm) having a gold undercoat and a chromium electrode vapor deposited thereon, and baked on a hot plate at 130° C. for 60 seconds, forming a resist film of 250 nm thick.

The resist film was exposed by means of an ArF exposure system ArFES3000 (Litho Tech Japan Co., Ltd.) and baked (PEB) at 110° C. for 60 seconds. The substrate was set on a quartz oscillator microbalance instrument RDA-Qz3 for resist development analysis (Litho Tech Japan Co., Ltd.). Development in a 2.38% aqueous solution of tetramethylammonium hydroxide was carried out for 60 seconds, during which swell and dissolution were measured (oscillation mode AT cut). Exposure was made in a varying exposure dose, and QCM measurement performed on every dose.

Figure 2:
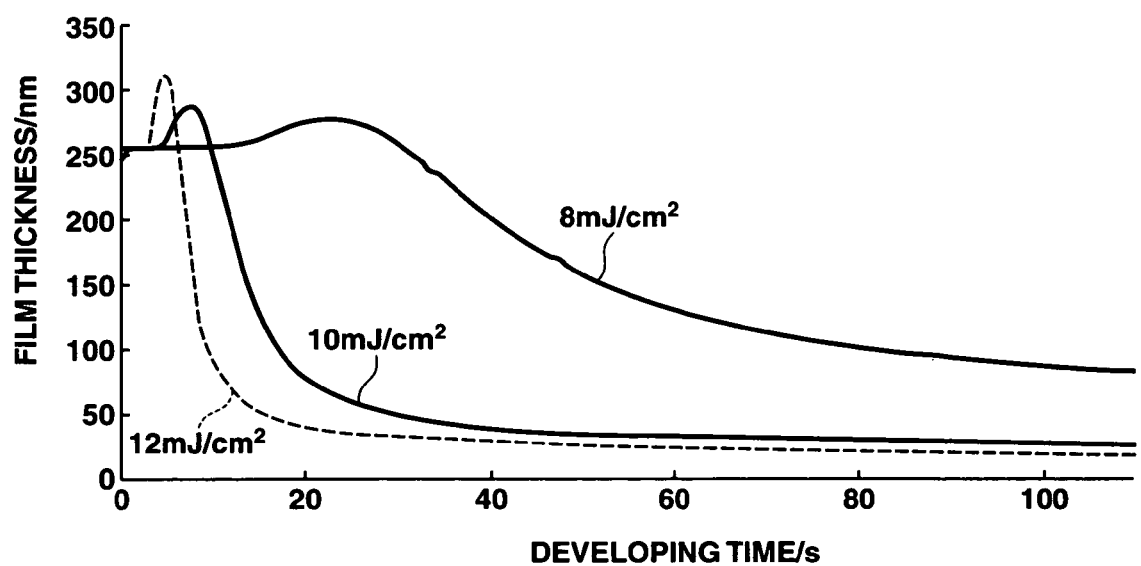
FIG. 2 is a graph showing the thickness versus developing time of a resist film formed from the resist composition of Comparative Example 1, as analyzed by the QCM technique.

The results from the resist compositions of Example 1 and Comparative Example 1 are plotted in FIGS. 1 and 2, respectively. In the charts plotting resist film thickness versus developing time, an increase of film thickness with developing time indicates swell, and a decrease of film thickness with developing time indicates dissolution. It is seen that the resist composition of Example 1 is significantly reduced in swell during development as measured by the QCM technique.

Dry Etching Test

Each polymer, 2 g, was thoroughly dissolved in 10 g of PGMEA, and passed through a filter having a pore size of 0.2 μm, obtaining a polymer solution. The polymer solution was spin coated onto a silicon substrate and baked, forming a polymer film of 300 nm thick. Dry etching tests were carried out on the polymer films by etching them under two sets of conditions.

(1) $CHF_3/CF_4$ Gas Etching Test

Using a dry etching instrument TE-8500P (Tokyo Electron K.K.), the polymer film was etched with $CHF_3/CF_4$ gas under the following conditions. The difference in polymer film thickness before and after etching was determined.

| | |
|---|---|
| Chamber pressure | 40.0 Pa |
| RF power | 1300 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

(2) $Cl_2/BCl_3$ Gas Etching Test

Using a dry etching instrument L-507D-L (Nichiden Anerba K.K.), the polymer film was etched with $Cl_2/BCl_3$ gas under the following conditions. The difference in polymer film thickness before and after etching was determined.

| | |
|---|---|
| Chamber pressure | 40.0 Pa |
| RF power | 300 W |
| Gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| Time | 60 sec |

The results of the etching tests are shown in Table 2.

TABLE 2

| Polymer | $CHF_3/CF_4$ gas etching rate (nm/min) | $Cl_2/BCl_3$ gas etching rate (nm/min) |
|---|---|---|
| Inventive Polymer 1 | 144 | 188 |
| Inventive Polymer 2 | 138 | 186 |
| Inventive Polymer 3 | 126 | 168 |
| Inventive Polymer 4 | 122 | 163 |
| Inventive Polymer 5 | 138 | 177 |
| Inventive Polymer 6 | 150 | 203 |
| Inventive Polymer 7 | 140 | 180 |
| Inventive Polymer 8 | 144 | 220 |
| Comparative Polymer 1 | 158 | 350 |
| Comparative Polymer 2 | 225 | 338 |
| Comparative Polymer 3 | 208 | 305 |
| Comparative Polymer 4 | 285 | 408 |

As is evident from Tables 1 and 2, resist compositions using inventive polymers not only exhibit an excellent sensitivity and resolution, and minimized line edge roughness when processed by ArF lithography, but also have good dry etching resistance as demonstrated by a minimized difference in film thickness after etching.

Japanese Patent Application No. 2004-115088 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer comprising recurring units of the general formulae (1a), (2a), and (1b):

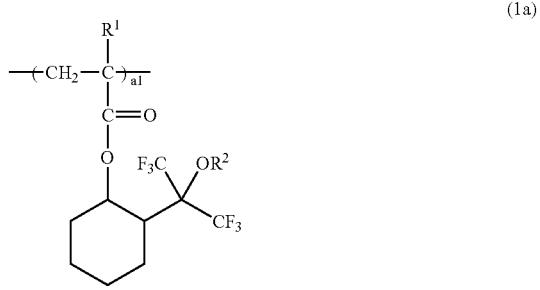

(1a)

(2a)

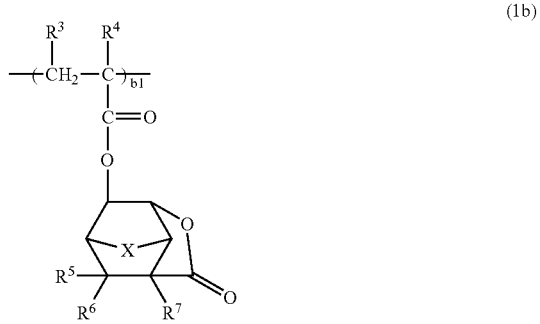

(1b)

wherein $R^1$ is each independently hydrogen or methyl, $R^2$ is each independently hydrogen, an acyl group of 1 to 10 carbon atoms, or an acid labile group, $R^3$ is hydrogen, methyl or $-CO_2R^8$, $R^4$ is hydrogen, methyl or $-CH_2CO_2R^8$, $R^5$ to $R^7$ are each independently hydrogen, methyl or $-CO_2R^9$, $R^8$ is each independently hydrogen or a straight, branched or cyclic alkyl group of 1 to 15 carbon atoms, $R^9$ is hydrogen or a straight, branched or cyclic alkyl group of 1 to 10 carbon atoms, X is $-CH_2-$, $-O-$ or $-S-$, with the proviso that X is not $-CH_2-$ when all $R^5$ to $R^7$ are hydrogen, a1, a2 and b1 are numbers satisfying $0 \leq a1/(a1+a2+b1) \leq 0.9$, $0 \leq a2/(a1+a2+b1) \leq 0.9$, $0 < (a1+a2)/(a1+a2+b1) \leq 0.9$, and $0 < b1/(a1+a2+b1) \leq 0.8$.

2. A chemically amplified positive resist composition comprising
(A) the polymer of claim 1 as a base resin,
(B) an organic solvent, and
(C) a photoacid generator.

3. The resist composition of claim 2, further comprising a dissolution inhibitor.

4. The resist composition of claim 2, further comprising a basic compound and/or a surfactant.

5. A process for forming a pattern comprising the steps of applying the resist composition of claim 1 onto a substrate, heat treating, exposing to high-energy radiation, and developing with a developer.

6. The pattern forming process of claim 5 wherein the high-energy radiation has a wavelength in the range of 180 to 200 nm.

* * * * *